United States Patent
Preikszas

(10) Patent No.: US 11,380,519 B1
(45) Date of Patent: Jul. 5, 2022

(54) OPERATING A PARTICLE BEAM GENERATOR FOR A PARTICLE BEAM DEVICE

(71) Applicant: Carl Zeiss Microscopy GmbH, Jena (DE)

(72) Inventor: Dirk Preikszas, Oberkochen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 69 days.

(21) Appl. No.: 17/089,861

(22) Filed: Nov. 5, 2020

(51) Int. Cl.
*H01J 37/28* (2006.01)
*H01J 37/244* (2006.01)
*H01J 37/305* (2006.01)
*H01J 37/302* (2006.01)
*H01J 37/145* (2006.01)

(52) U.S. Cl.
CPC ............ *H01J 37/28* (2013.01); *H01J 37/145* (2013.01); *H01J 37/244* (2013.01); *H01J 37/3023* (2013.01); *H01J 37/3053* (2013.01); *H01J 2237/24564* (2013.01)

(58) Field of Classification Search
CPC .......... H01J 37/00; H01J 37/02; H01J 37/023; H01J 37/04; H01J 37/06; H01J 37/28; H01J 37/145; H01J 37/244; H01J 37/3023; H01J 37/3053; H01J 37/08; H01J 2237/24564
USPC .................... 250/306, 307, 311, 492.1, 492.3
See application file for complete search history.

(56) References Cited

U.S. PATENT DOCUMENTS

| | | | |
|---|---|---|---|
| 6,459,082 B1* | 10/2002 | Sakaguchi | H01J 37/08 850/43 |
| 2004/0036031 A1 | 2/2004 | Rose et al. | |
| 2006/0145090 A1* | 7/2006 | Ohtsuka | B82Y 10/00 250/425 |
| 2017/0032926 A1* | 2/2017 | Miyamoto | H01J 37/3174 |

FOREIGN PATENT DOCUMENTS

WO WO 2002/067286 A2 8/2002

* cited by examiner

*Primary Examiner* — Jason L McCormack
(74) *Attorney, Agent, or Firm* — Muirhead and Saturnelli, LLC

(57) ABSTRACT

A particle beam generator for a particle beam device may be operated. A liquid metal may be provided from a container of a particle source to an emission device of the particle source and a first heating cycle for cleaning the particle source performed, which may comprise supplying a heating current to a heating device arranged at the emission device using a current supply unit, heating the emission device during a heating time period, measuring a value of a voltage drop at the heating device and/or at the current supply unit and adjusting at least one of: the heating current and the heating time period using the current supply unit, depending on the measured value of the voltage drop. A second heating cycle for cleaning the particle source may include using at least one of: the adjusted heating current and the adjusted heating time period, for heating the emission device.

20 Claims, 11 Drawing Sheets

OPERATING A PARTICLE BEAM GENERATOR FOR A PARTICLE BEAM DEVICE

TECHNICAL FIELD

The system described herein relates to a method for operating a particle beam generator for a particle beam device for imaging, analyzing and/or processing an object. Moreover, the system described herein relates to a particle beam device for carrying out this method. In particular, the particle beam device may be an ion beam device and/or an electron beam device.

BACKGROUND OF THE INVENTION

Electron beam devices, in particular a scanning electron microscope (also referred to as SEM below) and/or a transmission electron microscope (also referred to as TEM below), are used to examine objects (also referred to as samples) in order to obtain knowledge in respect of the properties and behavior of the objects under certain conditions.

In an SEM, an electron beam (also referred to as primary electron beam below) is generated by means of a beam generator and is focused on an object to be examined by means of a beam guiding system. An objective lens is used for focusing purposes. The primary electron beam is guided over a surface of the object to be examined by means of a deflection device. This is also referred to as scanning. The area scanned by the primary electron beam is also referred to as scanning region. During scanning, the electrons of the primary electron beam interact with the object to be examined. Interaction particles and/or interaction radiation result as a consequence of the interaction. By way of example, the interaction particles are electrons. In particular, electrons are emitted by the object—the so-called secondary electrons—and electrons of the primary electron beam are scattered back—the so-called backscattered electrons. The interaction particles form the so-called secondary particle beam and are detected by at least one particle detector. The particle detector generates detection signals which are used to generate an image of the object. An image of the object to be examined is thus obtained. By way of example, the interaction radiation is X-ray radiation or cathodoluminescence light. At least one radiation detector is used to detect the interaction radiation.

In the case of a TEM, a primary electron beam is likewise generated by means of a beam generator and directed onto an object to be examined by means of a beam guiding system. The primary electron beam passes through the object to be examined. When the primary electron beam passes through the object to be examined, the electrons of the primary electron beam interact with the material of the object to be examined. The electrons passing through the object to be examined are imaged onto a luminescent screen or onto a detector—for example in the form of a camera—by a system comprising an objective. By way of example, the aforementioned system additionally also comprises a projection lens. Imaging may also take place in the scanning mode of a TEM. Such a TEM is referred to as STEM. Additionally, provision may be made for detecting electrons scattered back at the object to be examined and/or secondary electrons emitted by the object to be examined, by means of at least one further detector in order to image the object to be examined.

Combining the functions of an STEM and an SEM in a single particle beam device is known. It is therefore possible to carry out examinations of objects with an SEM function and/or with an STEM function using this particle beam device.

Moreover, a particle beam device in the form of an ion beam column is known. Ions used for processing an object are generated using an ion beam generator arranged in the ion beam column. By way of example, material of the object is ablated or material is applied onto the object during the processing, wherein a gas may be used. The ions are additionally or alternatively used for imaging.

Furthermore, the prior art has disclosed the practice of analyzing and/or processing an object in a particle beam device using, on one hand, electrons and, on the other hand, ions. By way of example, an electron beam column having the function of an SEM is arranged at the particle beam device. Additionally, an ion beam column, which has been explained further above, is arranged at the particle beam device. The electron beam column with the SEM function serves, in particular, for examining further the processed or unprocessed object, but also for processing the object.

A particle beam generator in the form of an electron gun is known from the prior art. The known electron gun comprises an electron source having an electron emission surface. Furthermore, the electron gun comprises a first electrode configured to control the path of electrons emitted from the electron emission surface, a second electrode configured to suppress emissions of electrons from a side surface of the electron source and a third electrode configured to accelerate electrons emitted from the electron source to a final energy.

A further particle beam generator in the form of an ion beam generator is also known from the prior art. The ion beam generator comprises an ion source configured to emit ions, a suppressor electrode configured to suppress the emitted ions from a side surface of the ion source, an extractor electrode configured to extract the ions from the ion source, a first variable voltage supply unit for biasing the extractor electrode with an extractor voltage and a second variable voltage supply unit for biasing the suppressor electrode with a suppressor voltage. The particle beam generator provides an emission current comprising the ions.

It is known to use a liquid metal ion source as the ion source. The liquid metal ion source has a container comprising liquid metal, for example gallium. An emission device in the form of an emission wire having a tip is arranged at the container. The liquid metal flows from the container along a surface of the emission wire to the tip of the emission wire. Due to the arrangement of the ion source described above, the tip of the emission wire is exposed to an electric field sufficient to ionize atoms of the liquid metal and to extract them from the tip of the emission wire. Thereby, an ion beam comprising ions is generated.

It is known that the liquid metal of the liquid metal ion source may be contaminated during operation of the ion source, in particular by (i) residual gas particles in an area in which the ion source is arranged in the particle beam device and by (ii) material scattered from parts of the particle beam device, for example apertures and/or a housing of the particle beam device. Accordingly, the ion source should be cleaned from time to time, for example after 30 hours to 200 hours of operation.

Cleaning the ion source is carried out by heating up the liquid metal of the liquid metal ion source to a heating temperature, for example between 400° C. and 1000° C., in particular between 600° C. and 800° C. A heating wire is arranged at the emission wire for heating the emission wire and, therefore, the liquid metal arranged at the heating wire. For heating the heating wire, a heating current is applied to the heating wire in a heating time period using a current supply unit.

The heating temperature and the heating time period in which the liquid metal is heated should be controlled. If the heating temperature is higher than a temperature which causes evaporation of the liquid metal, a large amount of the liquid metal evaporates into the housing of the particle beam device. If the heating temperature is lower than a temperature which is needed for a sufficient cleaning of the liquid metal, the contaminated liquid metal may not have been sufficiently cleaned, which may cause problems when generating ions for the ion beam.

When heating the liquid metal, material of the liquid metal may be lost due to evaporation. Therefore, it is known to heat the ion source at certain times only, for example when a stable particle emission at a preferred beam current is no longer achieved. Alternatively, the ion source may be heated at a given time interval. For example, the time interval is chosen based on past experience. Especially when generating a large amount of contaminants by excessively processing many object positions using the ion beam, the known method of heating the ion source at a fixed time interval is advantageous: If the time interval is properly based on the type and amount of the contaminants, it can be avoided that cleaning of the ion source by heating fails due to heavy contamination.

One known method for controlling the heating temperature comprises experimentally determining a heating current being sufficient for obtaining the heating temperature. In this known method, the emission device of a specific ion source is heated. The quality of the ion beam generated by the ion source is examined depending on the heating current used. The heating current generating the best quality of the ion beam is determined and is used for operating any other ion source. It is also known to use a mathematical model for determining the heating temperature using several parameters, such as the geometry of the ion source, the actual amount of liquid metal comprised in the container of the ion source, the size of the container, the diameter and length of the heating wire and/or the diameter and length of the emission wire. However, this known method is disadvantageous due to a limited precision of measurement of the parameters used, which leads to a limited precision in obtaining the best heating temperature.

A further known method for controlling the heating temperature comprises choosing a heating current and varying the electric field until an emission of the ions starts. However, since the dependency of the start of the emission of ions on the contamination of the liquid metal is unknown, it is often unclear how the electric field should be varied to obtain an ion beam having a sufficient quality.

Therefore, it may be desirable to specify a method for operating a particle beam generator for a particle beam device for imaging, analyzing and/or processing an object and a particle beam device for carrying out this method which provide a simple means of cleaning a particle source such that a particle beam of good quality is obtained.

SUMMARY OF THE INVENTION

An embodiment of a method according to the system described herein may be used for operating a particle beam generator for a particle beam device for imaging, analyzing and/or processing an object. In particular, an embodiment of the method according to the system described herein may be used for cleaning at least one particle source of the particle beam generator such that a particle beam of good quality is generated by the particle beam generator. The particle beam may be an ion beam or an electron beam.

The aforementioned particle beam device may be an electron beam device and/or an ion beam device. As mentioned above, the particle beam generator may comprise the at least one particle source configured to emit charged particles. The charged particles may be electrons and/or ions. In particular, the particle source may be a liquid metal ion source (LMIS), for example a gallium liquid metal ion source. The particle source may have at least one container comprising at least one liquid metal. Moreover, the particle source may comprise at least one emission device arranged at the container. For example, the emission device may be an emission wire. Moreover, the particle beam generator may comprise a heating device arranged at the emission device, a current supply unit for providing a heating current to the heating device and a measuring unit for measuring a voltage drop at the heating device and/or at the current supply unit.

An embodiment of the method according to the system described herein comprises the step of providing the liquid metal from the container of the particle source to the emission device of the particle source. The liquid metal may flow from the container along a surface of the emission device. For example, the liquid metal may flow to a tip of the emission device.

Furthermore, an embodiment of the method according to the system described herein comprises the step of carrying out a first heating cycle for cleaning the particle source. The first heating cycle may comprise several steps. In particular, the first heating cycle may comprise the step of supplying the heating current to the heating device arranged at the emission device using the current supply unit. For example, the heating current may be in the range between 2 A and 6 A. Herein, the boundaries may be included in the range. The system described herein is not restricted to the aforementioned range. Rather, any value of the heating current may be chosen which is suitable for the system described herein. Furthermore, the first heating cycle may comprise the step of heating the emission device during a heating time period using the heating device heated by the heating current. The heating time period may be in the range of few seconds to a few minutes, for example in the range of 3 seconds to 10 minutes, wherein the boundaries may be included in the range. The system described herein is not restricted to the aforementioned range. Rather, any value of the heating time period may be chosen which is suitable for the system described herein. Moreover, the first heating cycle may comprise the step of measuring at least one value of a voltage drop at the heating device and/or at the current supply unit. Additionally, the first heating cycle may comprise the step of adjusting at least one of: the heating current and the heating time period using the current supply unit, depending on the measured value of the voltage drop. In other words, the first heating cycle may comprise the step of adjusting the heating current and/or the heating time period using the current supply unit, depending on the measured value of the voltage drop.

Moreover, an embodiment of the method according to the system described herein comprises the step of carrying out a second heating cycle for cleaning the particle source. When carrying out the second heating cycle, at least one of: the adjusted heating current and the adjusted heating time period may be used when heating the emission device. In other words, when carrying out the second heating cycle, the adjusted heating current and/or the adjusted heating time period may be used when heating the emission device.

The system described herein may be based on the realization that the voltage drop at the heating device and/or at the current supply unit may be used to adjust the heating current and/or the heating time period to find a sufficient heating current and/or sufficient heating time period for sufficiently cleaning the particle source. Moreover, the heating temperature may be controlled. In particular, the heating current and/or the heating time period may be adjusted in such a way that an evaporation of the liquid metal may be avoided. The system described herein also may take into account that the amount of liquid metal in the container of the particle source decreases over the operating time of the particle source. Due to this decrease, the heating current and/or the heating time period should be adjusted to achieve a sufficient cleaning of the particle source and for avoiding evaporation of the liquid metal.

The system described herein also may be based on the following thoughts. The heating current depends on the heating device, in particular on a length and a diameter of the heating device. Assuming that a sufficient heating current has been found to reach a sufficient heating temperature for sufficiently cleaning the particle source and is provided to the emission device, a specific electrical power for heating the emission device may be achieved. The electrical power achieved at the beginning of a heating cycle (hereinafter referred to as the initial electrical power) and the electrical power achieved at the end of the heating cycle (hereinafter referred to as the final electrical power) may differ due to the rising temperature of the heating device and, therefore, due to the increase of the resistance of the heating device, which may be dependent on the temperature. The final electrical power may be the same for every heating cycle of the particle source. The inventor has recognized that the difference between the final electrical power and the initial electrical power should be identical or nearly identical for each heating cycle. For example, a first difference between the final electrical power and the initial electrical power of the first heating cycle and a second difference between the final electrical power and the initial electrical power of a second heating cycle may differ by ±5%. The difference between the final electrical power and the initial electrical power may be hereinafter referred to as the differential electrical power $P_d$.

A relation of the differential electrical power $P_d$, the heating current $I_h$ and a differential voltage $U_d$ given by the difference between an initial voltage and a final voltage, wherein this difference is the voltage drop at the heating device and/or the current supply unit, may be given by $$\frac{P_d}{U_d} = I_h \qquad [1]$$

Therefore, if the differential voltage $U_d$ is determined and if the differential electrical power $P_d$ is given and/or known, the heating current $I_h$ being sufficient for sufficiently cleaning the particle source may be determined. For example, the differential electrical power $P_d$ may have the value of a target electrical power $P_t$ in the range of 1000 mW to 2000 mW, for example 1300 mW, wherein the boundaries may be included in the range. The system described herein is not restricted to the aforementioned range. Rather, any value of the target electrical power $P_t$ may be chosen which is suitable for the system described herein. For example, the target electrical power $P_t$ may be determined using values of the electrical power which have provided a sufficient cleaning of a particle source in the past and be, therefore, based on empirical values.

The system described herein also may be based on the thought that the differential voltage $U_d$ is determined by measuring values U(t) of the voltage drop at the heating device and/or the current supply unit over time. The voltage drop U(t) at the heating device and/or at the current supply unit depends on the temperature of the particle source. Moreover, the system described herein may be based on the thought that a regression analysis using a regression function $U_R(t)$ may be carried out on the measured values U(t) of the voltage drop to determine the differential voltage $U_d$. For example, an exponential regression function $U_R(t)$ in the form of $$U_R(t) = a + b \cdot \exp(c \cdot t) \qquad [2]$$

may be used during the regression analysis. Furthermore, a quadratic regression function $U_R(t)$ in the form of $$U_R(t) = a + b \cdot t + c \cdot t^2 \qquad [3]$$

may also be used during the regression analysis. After carrying out the regression analysis, the differential voltage $U_d$ may be calculated by subtracting the voltage at the beginning of the heating time period (t=0 s) from the voltage at the end of the heating time period $T_h$:

$$U_d = U_R(T_h) - U_R(0) \qquad [4]$$

Therefore, the differential voltage $U_d$ may be determined and may be used to determine the heating current $I_h$. The voltage drop in connecting lines of the heating device does not depend on the temperature of the particle source. Therefore, a measurement of the voltage drop at the heating device and a measurement at the current supply unit may be equivalent.

An embodiment of the method according to the system described herein additionally or alternatively provides that the step of supplying the heating current to the heating device comprises using a heating current which may be determined based on a resistance of the heating device and/or on a diameter of the heating device. This will be explained in detail further below.

A further embodiment of the method according to the system described herein additionally or alternatively provides that the heating current is adjusted if an operating time $Q_l$ of the particle source is lower than or equal to a given operating time threshold $Q_t$. In other words, the heating current may be adjusted if the following applies: $Q_l \leq Q_t$. The operating time $Q_l$ of the particle source may be the time integral over the emission current at which the particle source was operated in the past. The emission current of the particle source may be in the range of 1 μA to 5 μA, wherein the boundaries may be included in the range. The system described herein is not restricted to the aforementioned range. Rather, any value of the emission current may be chosen which is suitable for the system described herein. For example, the given operating time threshold $Q_t$ may be 400 μAh. This embodiment will be explained in detail further below.

Another embodiment of the method according to the system described herein additionally or alternatively provides that the heating time period is adjusted if the operating time $Q_l$ of the particle source is higher than the given operating threshold $Q_t$. In other words, the heating time period may be adjusted if the following applies: $Q_t \leq Q_l$. This embodiment will be explained in detail further below.

An embodiment of the method according to the system described herein additionally or alternatively provides that the measured value of the voltage drop is a first value. Moreover, this embodiment may be used when the heating current has been adjusted in the first heating cycle. Furthermore, the second heating cycle may comprise supplying the adjusted heating current to the heating device arranged at the emission device using the current supply unit, heating the emission device during the heating time period using the heating device heated by the adjusted heating current, measuring at least one second value of the voltage drop at the heating device and/or at the current supply unit, and adjusting at least one of: the adjusted heating current and the heating time period using the current supply unit, depending on the measured second value of the voltage drop. The aforementioned newly adjusted heating current and/or the aforementioned adjusted heating time period may be used in a further heating cycle for cleaning the particle source, for example a third heating cycle for cleaning the particle source. The steps of the second heating cycle may be repeated in the further heating cycle using the aforementioned newly adjusted heating current and/or the aforementioned adjusted heating time period.

A further embodiment of the method according to the system described herein additionally or alternatively provides that the measured value of the voltage drop is a first value. Moreover, this embodiment may be used when the heating time period has been adjusted in the first heating cycle. Furthermore, the second heating cycle may comprise supplying the heating current to the heating device arranged at the emission device using the current supply unit, heating the emission device during the adjusted heating time period using the heating device heated by the heating current, measuring at least one second value of the voltage drop at the heating device and/or at the current supply unit, and adjusting at least one of: the heating current and the adjusted heating time period using the current supply unit, depending on the measured second value of the voltage drop. The aforementioned adjusted heating current and/or the aforementioned newly adjusted heating time period may be used in a further heating cycle for cleaning the particle source. The steps of the second heating cycle may be repeated in the further heating cycle using the aforementioned adjusted heating current and/or the aforementioned newly adjusted heating time period.

Another embodiment of the method according to the system described herein additionally or alternatively provides that the measured value of the voltage drop is a first value. Moreover, this embodiment may be used when the heating current as well as the heating time period have been adjusted. The second heating cycle may comprise supplying the adjusted heating current to the heating device arranged at the emission device using the current supply unit, heating the emission device during the adjusted heating time period using the heating device heated by the adjusted heating current, measuring at least one second value of the voltage drop at the heating device and/or at the current supply unit, and adjusting again at least one of: the adjusted heating current and the adjusted heating time period using the current supply unit, depending on the measured second value of the voltage drop. The aforementioned newly adjusted heating current and/or the aforementioned newly adjusted heating time period may be used in a further heating cycle for cleaning the particle source. The steps of the second heating cycle may be repeated in the further heating cycle using the aforementioned newly adjusted heating current and/or the aforementioned newly adjusted heating time period.

An embodiment of the method according to the system described herein additionally or alternatively provides that the first heating cycle is stopped depending on the measured value of the voltage drop. Furthermore, it is additionally or alternatively provided in an embodiment of the method according to the system described herein that the second heating cycle is stopped depending on the measured value of the voltage drop. For example, the first heating cycle and/or the second heating cycle may be stopped if the voltage drop $U(t)$ at the heating device and/or at the current supply unit exceeds a given differential voltage threshold $U_t$, for example by more than 50 mV. The differential voltage threshold $U_t$ may be given by the following equation:

$$U_t = \frac{P_t}{I_h} + U(0) \qquad [5]$$

wherein $U_t$ is the differential voltage threshold, $P_t$ is the target electrical power, $I_h$ is the heating current currently used and $U(0)$ is the voltage drop at the heating device and/or at the current supply unit at the initial time, which is $t=0$ s. This embodiment will be explained in detail further below. Furthermore, further embodiments of stopping the method according to the system described herein are also explained further below. These further embodiments may be additionally or alternatively implemented.

A further embodiment of the method according to the system described herein additionally or alternatively provides that the measured value of the voltage drop is a first value. Furthermore, such an embodiment may comprise measuring at least one second value of the voltage drop at the heating device and/or at the current supply unit when carrying out the first heating cycle and determining an increase of the voltage drop based on the measured first value and the measured second value of the voltage drop. Therefore, rather than just measuring a value of the voltage drop, the increase of the voltage drop based on the measured first value and on the measured second value of the voltage drop may be determined. Additionally, the embodiment of the method may comprise using the determined increase of the voltage drop for adjusting at least one of: the heating current and the heating time period. Another embodiment of the method according to the system described herein additionally or alternatively comprises that the step of determining the increase of the voltage drop comprises determining the increase of the voltage drop during a given time period.

A further embodiment of the method according to the system described herein additionally or alternatively provides determining a derivative with respect to a given time using the measured value of the voltage drop at the heating device and/or at the current supply unit. Furthermore, the step of adjusting at least one of: the heating current and the heating time period may comprise using the determined derivative.

Moreover, the particle beam generator may comprise at least one suppressor electrode configured to suppress emissions of the charged particles from a side surface of the particle source, at least one extractor electrode configured to extract the charged particles from the particle source, at least one first voltage supply unit for biasing the extractor electrode with an extractor voltage and at least one second voltage supply unit for biasing the suppressor electrode with a suppressor voltage. An embodiment of the method according to the system described herein additionally or alternatively provides at least one of: (i) applying a first voltage using the first voltage supply unit to the extractor electrode configured to extract charged particles from the particle source, and (ii) applying a second voltage using the second voltage supply unit to the suppressor electrode configured to suppress emissions of the charged particles from a side surface of the particle source.

A further embodiment of the method according to the system described herein additionally or alternatively provides that a regression analysis is used when the heating current and/or the heating time period is/are adjusted.

The system described herein also refers to a computer program product comprising a program code which may be loaded or is loaded into a processor and which, when being executed, controls a particle beam device in such a way that a method comprising at least one of the above mentioned or further below mentioned steps or a combination of at least two of the above mentioned or further below mentioned steps is carried out.

The system described herein also refers to a particle beam device for imaging, analyzing and/or processing an object. The particle beam device may comprise at least one particle beam generator for generating a particle beam comprising charged particles. The charged particles may be, for example, electrons, ions, positrons or any other charged particle. The particle beam generator may comprise a particle source. In particular, the particle source may be a liquid metal ion source (LMIS), for example a gallium liquid metal ion source. Moreover, the particle beam generator may comprise an emission device configured to emit charged particles and a container comprising liquid metal, a heating device arranged at the emission device, a current supply unit for providing a heating current and a measuring unit for measuring a voltage drop at the heating device and/or at the current supply unit. The particle beam device according to the system described herein also may comprise at least one processor into which a computer program product as the one mentioned above is loaded.

An embodiment of the particle beam device according to the system described herein additionally or alternatively provides for at least one of: (i) the heating device being a heating wire, and (ii) the emission device being an emission wire, in particular comprising a tip.

A further embodiment of the particle beam device according to the system described herein additionally or alternatively provides that the particle beam generator comprises at least one of the following: (i) a suppressor electrode configured to suppress emissions of the charged particles from a side surface of the particle source, and (ii) an extractor electrode configured to extract the charged particles from the particle source. Furthermore, the particle beam generator may comprise at least one first voltage supply unit for biasing the extractor electrode with an extractor voltage and at least one second voltage supply unit for biasing the suppressor electrode with a suppressor voltage. In other words, the particle beam generator may comprise at least one first voltage supply unit applying an extractor voltage to the extractor electrode and at least one second voltage supply unit applying a suppressor voltage to the suppressor electrode. For example, the extractor voltage may be in the range of (−5) kV to (−10) kV or (−6) kV to (−8) kV, wherein the boundaries may be included in the range in each case. Moreover, the suppressor voltage may be chosen, for example, in the range of 0 V to 2 kV, wherein the boundaries may be included in the range. The system described herein is not restricted to the aforementioned ranges. Rather, any value of the extractor voltage and the suppressor voltage may be chosen which is suitable for the system described herein.

Another embodiment of the particle beam device according to the system described herein additionally or alternatively has at least one objective lens for focusing the particle beam onto the object. Moreover, the particle beam device according to the system described herein may have at least one detector for detecting interaction particles and/or interaction radiation, the interaction particles and the interaction radiation being generated when the particle beam impinges on the object. The interaction particles may be secondary particles and/or backscattered particles, in particular secondary electrons, backscattered ions, and backscattered electrons. The interaction radiation may be X-rays and/or cathodoluminescence light.

An embodiment of the particle beam device according to the system described herein additionally or alternatively provides that the particle beam generator is a first particle beam generator for generating a first particle beam comprising first charged particles. The objective lens may be a first objective lens for focusing the first particle beam onto the object. The particle beam device according to the embodiment of the system described herein further may comprise a second particle beam generator for generating a second particle beam comprising second charged particles and a second objective lens for focusing the second particle beam onto the object. The second charged particles may be electrons and/or ions.

An embodiment of the particle beam device according to the system described herein additionally or alternatively provides that the particle beam device is at least one of the following: an electron beam device and an ion beam device. In particular, the particle beam device may be both an electron beam device and an ion beam device. The electron beam device and the ion beam device may be arranged at an angle to each other, for example an angle in the range of 45° to 90°, wherein the boundaries may be included in this range. In particular, the electron beam device and the ion beam device may be arranged at an angle of 54° to each other. However, the system described herein is not restricted to the above mentioned angles. Rather, any angle between the electron beam device and the ion beam device which is suitable for the system described herein may be used.

A further method according to the system described herein also may be used for operating a particle beam generator for a particle beam device for imaging, analyzing and/or processing an object. In particular, the further method according to the system described herein may be used for cleaning at least one particle source of the particle beam generator such that a particle beam of good quality is generated by the particle beam generator. The particle beam may be an ion beam or an electron beam.

The aforementioned particle beam device may be an electron beam device and/or an ion beam device. As mentioned above, the particle beam generator may comprise the at least one particle source configured to emit charged particles. The charged particles may be electrons and/or ions. In particular, the particle source may be a liquid metal ion source (LMIS), for example a gallium liquid metal ion source. The particle source may have at least one container comprising at least one liquid metal. Moreover, the particle source may comprise at least one emission device arranged at the container. For example, the emission device may be an emission wire. Moreover, the particle beam generator may comprise a heating device arranged at the emission device, a current supply unit for providing a heating current to the heating device and a measuring unit for measuring a voltage drop at the heating device and/or at the current supply unit.

The further method according to the system described herein may comprise the step of providing the liquid metal from the container of the particle source to the emission device of the particle source. The liquid metal may flow from the container along a surface of the emission device. For example, the liquid metal may flow to a tip of the emission device.

Furthermore, the further method according to the system described herein may comprise the step of cleaning the particle source during a heating cycle. During the heating cycle, a heating current may be supplied to the heating device arranged at the emission device using the current supply unit. For example, the heating current may be in the range between 2 A and 6 A. Herein, the boundaries may be included in the range. The system described herein is not restricted to the aforementioned range. Rather, any value of the heating current may be chosen which is suitable for the system described herein. Furthermore, the emission device may be heated using the heating device heated by the heating current.

Moreover, the further method according to the system described herein may comprise the step of measuring at least one value of a voltage drop at the heating device and/or at the current supply unit. Additionally, a differential electrical power may be determined using the measured at least one value of the voltage drop. In particular, a regression analysis may be used when determining the differential electrical power. The differential electrical power may be the difference between a first electrical power and a second electrical power. For example, the first electrical power may be the final electrical power as outlined above. Moreover, the second electrical power may be the initial electrical power as outlined above. The supply of the heating current may be stopped if the differential electrical power exceeds a given target electrical power.

BRIEF DESCRIPTION OF THE DRAWINGS

Embodiments of the system described herein will be explained in more detail in the following text with reference to the figures, in which.

DESCRIPTION OF VARIOUS EMBODIMENTS

Figure 1:
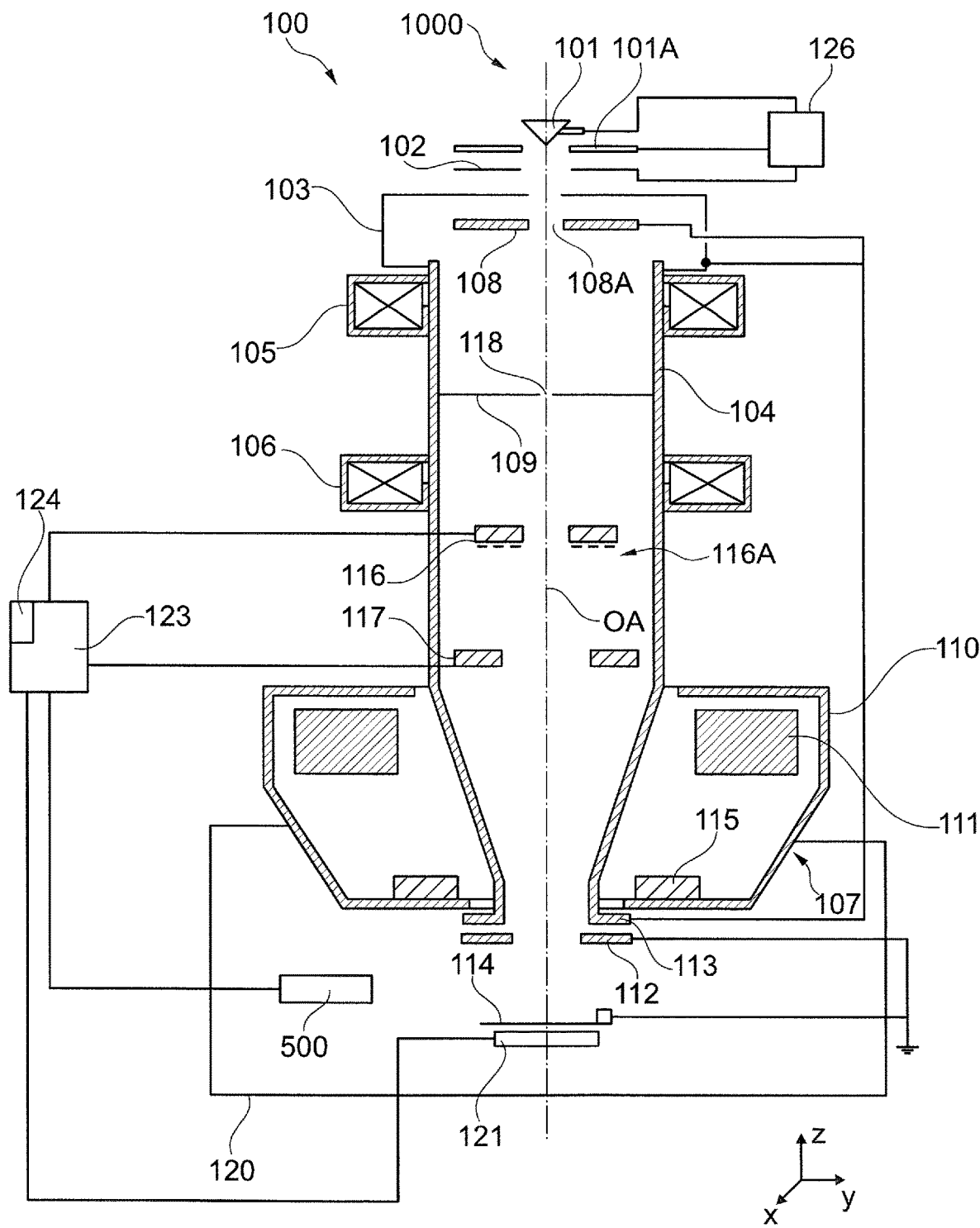
FIG. 1 shows a schematic representation of a first embodiment of a particle beam device.

FIG. 1 shows a schematic representation of an SEM 100. The SEM 100 may have a particle beam generator 1000 comprising an electron source 101 being a cathode, a suppressor electrode 101A and an extractor electrode 102. Furthermore, the SEM 100 may comprise an anode 103 which may be arranged at the end of a beam guide tube 104 of the SEM 100. The electron source 101 is, for example, a thermal field emitter. However, the system described herein is not limited to such an electron source. Instead, any electron source may be used.

The particle beam generator 1000 may comprise a beam generator control unit 126. The electron source 101, the suppressor electrode 101A and the extractor electrode 102 may be connected to the beam generator control unit 126 and may be supplied with voltage by the beam generator control unit 126. This will be explained in detail further below.

Electrons emerging from the electron source 101 form a primary electron beam. The electrons may be accelerated to an anode potential due to a potential difference between the electron source 101 and the anode 103. The anode potential in this illustrative embodiment may be between 0.2 kV and 30 kV relative to the ground potential of an object chamber 120, for example, 5 kV to 15 kV, in particular 8 kV, but alternatively, the anode also may be at ground potential.

Two condenser lenses may be arranged at the beam guide tube 104, i.e. a first condenser lens 105 and a second condenser lens 106, the first condenser lens 105 being situated first, and then the second condenser lens 106, as viewed from the electron source 101 toward an objective lens 107. However, the system described herein is not limited to the use of two condenser lenses. Instead, further embodiments may comprise only a single condenser lens.

A first aperture unit 108 may be arranged between the anode 103 and the first condenser lens 105. The first aperture unit 108 is, together with the anode 103 and the beam guide tube 104, at high-voltage potential, i.e. the potential of the anode 103, or at ground potential. The first aperture unit 108 may have several first aperture openings 108A. One of those first aperture openings 108A is shown in FIG. 1. For example, the first aperture unit 108 may have two first aperture openings 108A. Each of the several first aperture openings 108A may have a different opening diameter. A chosen first aperture opening 108A may be arranged at an optical axis OA of the SEM 100 using an adaption mechanism. However, the system described herein is not limited to this embodiment. Instead, in an alternative embodiment, the first aperture unit 108 may have a single first aperture opening 108A only. No adaption mechanism is used for this alternative embodiment. The first aperture unit 108 of this alternative embodiment may be fixedly arranged around the optical axis OA.

A stationary second aperture unit 109 may be arranged between the first condenser lens 105 and the second condenser lens 106. Alternatively, the second aperture unit 109 is moveable.

The objective lens 107 may have pole pieces 110, in which a bore has been made. The beam guide tube 104 may be arranged and guided through this bore. Further, a coil 111 may be arranged in the pole pieces 110.

An electrostatic deceleration device may be situated downstream from the beam guide tube 104. It may have a single electrode 112 and a tube electrode 113 arranged at the end of the beam guide tube 104 facing an object 114. Consequently, the tube electrode 113 is, together with the beam guide tube 104, at the potential of the anode 103, while the single electrode 112 and the object 114 may be at a lower potential than that of the anode 103. In this case, this may be the ground potential of the object chamber 120. Thus, the electrons of the primary electron beam may be decelerated to the desired energy required for analyzing the object 114.

In addition, the SEM 100 may have a scanning device 115, via which the primary electron beam may be deflected and scanned across the object 114. In this process, the electrons of the primary electron beam may interact with the object 114. As a consequence of this interaction, interaction particles and/or interaction radiation will result, which may be detected. The detection signals obtained in this manner may be evaluated.

As interaction particles, in particular electrons are emitted from the surface of the object 114 (so-called secondary electrons) or electrons of the primary electron beam are scattered back (so-called backscattered electrons). For detecting secondary electrons and/or backscattered electrons, a detector system which may have a first detector 116 and a second detector 117 may be arranged in the beam guide tube 104. The first detector 116 may be arranged on the source-side along the optical axis OA, while the second detector 117 may be arranged on the object-side along the optical axis OA in the beam guide tube 104. In addition, the first detector 116 and the second detector 117 may be arranged offset against each other toward the optical axis OA of the SEM 100. Both the first detector 116 and the second detector 117 each may have a through opening through which the primary electron beam may pass, and they may be approximately at the potential of the anode 103 and the beam guide tube 104. The optical axis OA of the SEM 100 passes through the corresponding through openings.

The second detector 117 may be used to detect mostly secondary electrons. Secondary electrons emitting from the object 114 may have a low kinetic energy and arbitrary direction of movements. However, the secondary electrons may be accelerated due to a strong extraction field generated by the tube electrode 113 in the direction of the objective lens 107. The secondary electrons enter the objective lens 107 nearly parallel to the optical axis OA. A diameter of the beam bunch of the secondary electrons may be small in the objective lens 107. The objective lens 107, however, affects the beam of secondary electrons and generates a short focus of the secondary electrons having relatively steep angles with respect to the optical axis OA such that the secondary electrons diverge from each other after the focus and may impinge on the second detector 117. Electrons backscattered from the object 114, i.e. backscattered electrons, may have a relatively high kinetic energy as compared to secondary electrons when exiting from the object 114. Backscattered electrons may be detected only to a very small degree by the second detector 117. The high kinetic energy and the angle of the beam of backscattered electrons with respect to the optical axis OA when backscattered from the object 114 result in a beam waist, i.e. a beam area having a minimal diameter, of the backscattered electrons, the beam waist being arranged in the vicinity of the second detector 117. Therefore, a large part of the backscattered electrons passes through the opening of the second detector 117. Accordingly, backscattered electrons may be detected mainly by the first detector 116.

The first detector 116 of a further embodiment of the SEM 100 may have an opposing field grid 116A which may be a field grid with an opposing potential. The opposing field grid 116A may be arranged at the side of the first detector 116 facing the object 114. The opposing field grid 116A may comprise a negative potential with respect to the potential of the beam guide tube 104 such that mainly or only backscattered electrons having a high energy may pass the opposing field grid 116A and impinge on the first detector 116. Additionally or alternatively, the second detector 117 may have a further opposing field grid being designed similarly to the above mentioned opposing field grid 116A of the first detector 116 and having an analog function.

The detection signals generated by the first detector 116 and the second detector 117 may be used to generate an image or images of the surface of the object 114.

It is pointed out expressly that the aperture openings of the first aperture unit 108 and the second aperture unit 109 as well as the through openings of the first detector 116 and the second detector 117 are represented in an exaggerated manner. The through openings of the first detector 116 and the second detector 117 may have a maximum length of between 1 mm and 5 mm perpendicular to the optical axis OA, wherein the boundaries may be included in this range. For example, they may have a circular design and a diameter in the range of 1 mm to 3 mm perpendicular to the optical axis OA.

In the illustrative embodiment shown here, the second aperture unit 109 is a circular aperture having a second aperture opening 118 for the primary electron beam to pass through, the second aperture opening 118 having an extension in the range of 25 µm to 50 µm, wherein the boundaries may be included in this range, for example, 35 µm. The second aperture unit 109 may be a pressure stage aperture. The second aperture unit 109 of a further illustrative embodiment may have several openings which may be mechanically moved with respect to the primary electron beam or which may be passed through by the primary electron beam using electrical and/or magnetic deflection devices. As mentioned above, the second aperture unit 109 may also be a pressure stage unit. It separates a first area, in which the electron source 101 may be arranged, having an ultra-high vacuum ($10^{-7}$ to $10^{-12}$ hPa), from a second area with a high vacuum ($10^{-3}$ to $10^{-7}$ hPa). The second area may be the intermediate pressure area of the beam guide tube 104 leading to the object chamber 120.

In addition to the detector system mentioned above, the SEM 100 may have a radiation detector 500 which may be arranged in the object chamber 120. The radiation detector 500 may be, for example, positioned between the beam guide tube 104 and the object 114. Moreover, the radiation detector 500 may also be positioned at the side of the object 114. The radiation detector 500 may be a silicon drift diode (SDD).

The object chamber 120 may be operated in a first pressure range or in a second pressure range, wherein the first pressure range only comprises pressures lower than or equal to $10^{-3}$ hPa and wherein the second pressure range only comprises pressures over $10^{-3}$ hPa. A pressure sensor (not shown in FIG. 1) may be arranged in the object chamber 120 for measuring the pressure in the object chamber 120. A vacuum system (not shown in FIG. 1) in the form of a pump system being connected to the pressure sensor and being arranged at the object chamber 120 may provide for the pressure range, either the first pressure range or the second pressure range, in the object chamber 120.

The SEM 100 may further have a third detector 121 which may be arranged in the object chamber 120. The third detector 121 may be arranged downstream of the object 114 viewed from the electron source 101 in the direction of the object 114 along the optical axis OA. The primary electron beam may be transmitted through the object 114. Electrons of the primary electron beam may interact with the material of the object 114. Electrons transmitted through the object 114 will be detected using the third detector 121.

The first detector 116, the second detector 117, the third detector 121 and the radiation detector 500 may be connected to a control unit 123. The control unit 123 may comprise a processor 124 into which a computer program product comprising a program code may be loaded, which, when being executed, controls the SEM 100 in such a way that a method according to the system described herein may be carried out. This will be explained further below.

Figure 2:
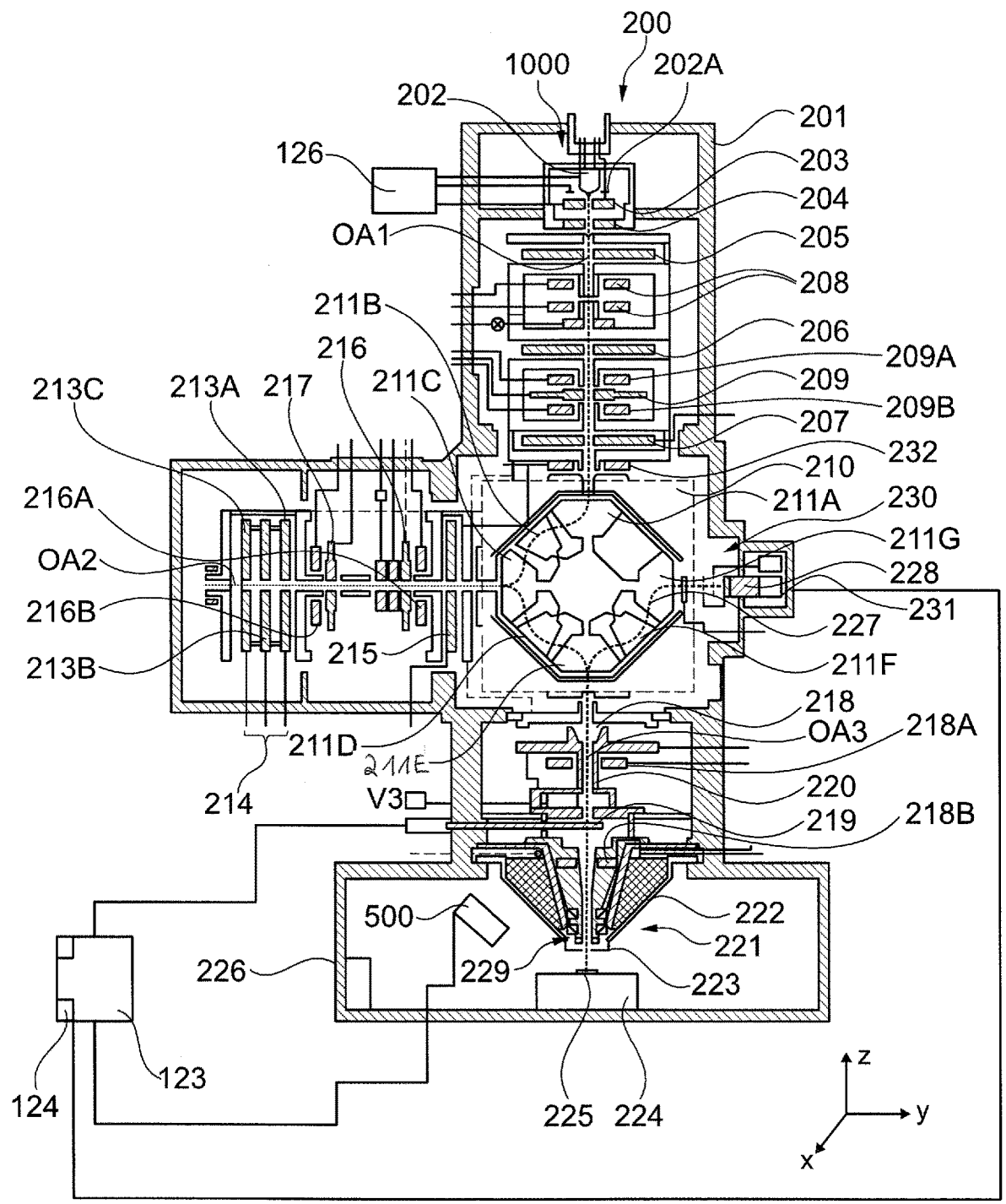
FIG. 2 shows a schematic representation of a second embodiment of a particle beam device.

FIG. 2 is a schematic illustration of a further embodiment of a particle beam device according to the system described herein. This embodiment of the particle beam device is denoted by reference sign 200 and may comprise a mirror corrector for correcting, for example, chromatic and spherical aberrations. This will be explained in detail further below. The particle beam device 200 may comprise a particle beam column 201 being embodied as an electron beam column and, in principle, corresponds to an electron beam column of a corrected SEM. However, the particle beam device 200 according to the system described herein is not restricted to an SEM with a mirror corrector. Rather, any particle beam device comprising correction units may be used.

The particle beam column 201 may comprise a particle beam generator 1000 having an electron source 202 being a cathode, a suppressor electrode 202A and an extractor electrode 203. Moreover, the particle beam column 201 may comprise an anode 204. By way of example, the electron source 202 may be a thermal field emitter. Electrons which emerge from the electron source 202 may be accelerated by the extractor electrode 203 and brought to a certain kinetic energy by the anode 204 corresponding to a potential difference between the electron source 202 and the anode 204. Accordingly, a primary particle beam in the form of an electron beam may be provided along a first optical axis OA1.

The particle beam generator 1000 may comprise a beam generator control unit 126. The electron source 202, the suppressor electrode 202A and the extractor electrode 203 may be connected to the beam generator control unit 126 and may be supplied with voltage by the beam generator control unit 126. This will be explained in detail further below.

The primary particle beam may be guided along a beam path which—after the primary particle beam has emerged from the electron source 202—may be approximately the first optical axis OA1, using a first electrostatic lens 205, a second electrostatic lens 206 and a third electrostatic lens 207.

The primary particle beam may be adjusted along the beam path using at least one beam alignment device. The beam alignment device of this embodiment may comprise a gun alignment unit comprising two magnetic deflection units 208 arranged along the first optical axis OA1. Furthermore, the particle beam device 200 may comprise electrostatic beam deflection units. A first electrostatic beam deflection unit 209 may be arranged between the second electrostatic lens 206 and the third electrostatic lens 207. The first electrostatic beam deflection unit 209 also may be arranged downstream of the magnetic deflection units 208. A first multipole unit 209A in the form of a first magnetic deflection unit may be arranged on one side of the first electrostatic beam deflection unit 209. Furthermore, a second multipole unit 209B in the form of a second magnetic deflection unit may be arranged on the other side of the first electrostatic beam deflection unit 209. The first electrostatic beam deflection unit 209, the first multipole unit 209A and the second multipole unit 209B may be used for adjusting the primary particle beam with respect to an axis of the third electrostatic lens 207 and an entrance window of a beam deflection device 210. The first electrostatic beam deflection unit 209, the first multipole unit 209A and the second multipole unit 209B may act together as a Wien filter. A further magnetic deflection device 232 may be arranged at the entrance of the beam deflection device 210.

The beam deflection device 210 may be used as a particle-optical beam splitter which deflects the primary particle beam in a specific way. The beam deflection device 210 may comprise several magnetic sectors, namely a first magnetic sector 211A, a second magnetic sector 211B, a third magnetic sector 211C, a fourth magnetic sector 211D, a fifth magnetic sector 211E, a sixth magnetic sector 211F and a seventh magnetic sector 211G. The primary particle beam enters the beam deflection device 210 along the first optical axis OA1 and may be deflected by the beam deflection device 210 in the direction of a second optical axis OA2. The beam deflection may be affected by the first magnetic sector 211A, the second magnetic sector 211B and the third magnetic sector 211C at an angle of 30° to 120°. The second optical axis OA2 may be arranged at an identical angle to the first optical axis OA1. The beam deflection device 210 also deflects the primary particle beam which may be guided along the second optical axis OA2 in the direction of a third optical axis OA3. The beam deflection may be affected by the third magnetic sector 211C, the fourth magnetic sector 211D and the fifth magnetic sector 211E. In the embodiment shown in FIG. 2, deflecting to the second optical axis OA2 and to the third optical axis OA3 will be done by deflecting the primary particle beam at an angle of 90°. Thus, the third optical axis OA3 runs coaxially to the first optical axis OA1. However, the particle beam device 200 according to the system described herein is not restricted to deflection angles of 90°. Rather, any suitable deflection angle may be used with the beam deflection device 210, for example 70° or 110°, such that the first optical axis OA1 does not run coaxially to the third optical axis OA3. For further details of the beam deflection device 210, reference is made to WO 2002/067286 A2, which is incorporated herein by reference.

After being deflected by the first magnetic sector 211A, the second magnetic sector 211B and the third magnetic sector 211C, the primary particle beam may be guided along the second optical axis OA2. The primary particle beam may be guided to an electrostatic mirror 214 and passes—on its way to the electrostatic mirror 214—a fourth electrostatic lens 215, a third multipole unit 216A in the form of a magnetic deflection unit, a second electrostatic beam deflection unit 216, a third electrostatic beam deflection unit 217 and a fourth multipole unit 216B in the form of a magnetic deflection unit. The electrostatic mirror 214 may comprise a first mirror electrode 213A, a second mirror electrode 213B and a third mirror electrode 213C. Electrons of the primary particle beam which are reflected back by the electrostatic mirror 214 run again along the second optical axis OA2 and enter again the beam deflection device 210. They may be deflected by the third magnetic sector 211C, the fourth magnetic sector 211D and the fifth magnetic sector 211E towards the third optical axis OA3. The electrons of the primary particle beam exit the beam deflection device 210, being guided along the third optical axis OA3 to the object 225 to be examined. On its way to the object 225, the primary particle beam passes a fifth electrostatic lens 218, a beam guiding tube 220, a fifth multipole unit 218A, a sixth multipole unit 218B and an objective lens 221. The fifth electrostatic lens 218 may be an electrostatic immersion lens. The primary particle beam may be decelerated or accelerated by the fifth electrostatic lens 218 to the electrical potential of the beam guiding tube 220.

The primary particle beam may be focused by the objective lens 221 in a focal plane in which the object 225 is positioned. The object 225 may be arranged on a movable sample stage 224. The movable sample stage 224 may be arranged in an object chamber 226 of the particle beam device 200.

The objective lens 221 may be implemented as a combination of a magnetic lens 222 and a sixth electrostatic lens 223. The end of the beam guiding tube 220 may be one electrode of an electrostatic lens. Particles of the primary particle beam, after exiting from the beam guiding tube 220, may be decelerated to the potential of the object 225 arranged on the sample stage 224. The objective lens 221 is not restricted to a combination of the magnetic lens 222 and the sixth electrostatic lens 223. Instead, the objective lens 221 may be implemented in any suitable form. In particular, the objective lens 221 may also be just a mere magnetic lens or just a mere electrostatic lens.

The primary particle beam focused on the object 225 may interact with the object 225. Interaction particles and interaction radiation may be generated. In particular, secondary electrons may be emitted by the object 225 and backscattered electrons may be returned from the object 225. The secondary electrons and the to backscattered electrons may be again accelerated and may be guided into the beam guiding tube 220 along the third optical axis OA3. In particular, the secondary electrons and backscattered electrons travel on the beam path of the primary particle beam in the opposite direction of the primary particle beam.

The particle beam device 200 may comprise a first detector 219 which may be arranged along the beam path between the beam deflection device 210 and the objective lens 221. Secondary electrons which are guided in directions oriented at large angles with respect to the third optical axis OA3 may be detected by the first detector 219. However, backscattered electrons and secondary electrons which are guided in directions having a small axial distance with respect to the third optical axis OA3 at the first detector 219, i.e. backscattered electrons and secondary electrons having a small distance from the third optical axis OA3 at the position of the first detector 219, enter the beam deflection device 210 and may be deflected by the fifth magnetic sector 211E, the sixth magnetic sector 211F and the seventh magnetic sector 211G along a detection beam path 227 to a second detector 228 of an analysis unit 231. The total deflection angle may be, for example, 90° or 110°.

The first detector 219 generates detection signals mostly based on the emitted secondary electrons. The second detector 228 of the analysis unit 231 generates detection signals mostly based on backscattered electrons. The detection signals generated by the first detector 219 and the second detector 228 may be transmitted to a control unit 123 and may be used to obtain information about the properties of the interaction area of the focused primary particle beam with the object 225. If the focused primary particle beam is scanned over the object 225 using a scanning device 229, and if the control unit 123 acquires and stores the detection signals generated by the first detector 219 and the second detector 228, an image of the scanned area of the object 225 may be acquired and displayed by the control unit 123 or a monitor (not shown).

A filter electrode 230 may be arranged in front of the second detector 228 of the analysis unit 231. The filter electrode 230 may be used to separate the secondary electrons from the backscattered electrons due to the kinetic energy difference between the secondary electrons and the backscattered electrons.

In addition to the first detector 219 and the second detector 228, the particle beam device 200 also may have a radiation detector 500 which may be arranged in the object chamber 226. The radiation detector 500 may be positioned at the side of the object 225 and may be directed to the object 225. The radiation detector 500 may be a silicon drift diode (SDD) and/or a photodiode and detects interaction radiation arising from the interaction of the primary particle beam with the object 225, in particular X-rays and/or cathodoluminescence light.

The object chamber 226 may be operated in a first pressure range or in a second pressure range, wherein the first pressure range only comprises pressures lower than or equal to $10^{-3}$ hPa and wherein the second pressure range only comprises pressures over $10^{-3}$ hPa. A pressure sensor (not shown in FIG. 2) may be arranged in the object chamber 226 for measuring the pressure in the object chamber 226. A vacuum system (not shown in FIG. 2) in the form of a pump system being connected to the pressure sensor and being arranged at the object chamber 226 provides for the pressure range in the object chamber 226, either the first pressure range or the second pressure range.

The first detector 219, the second detector 228 of the analysis unit 231 and the radiation detector 500 may be connected to the control unit 123. The control unit 123 may comprise a processor 124 into which a computer program product comprising a program code may be loaded, which, when being executed, controls the particle beam device 200 in such a way that a method according to the system described herein is carried out. This will be explained further below.

Figure 3:
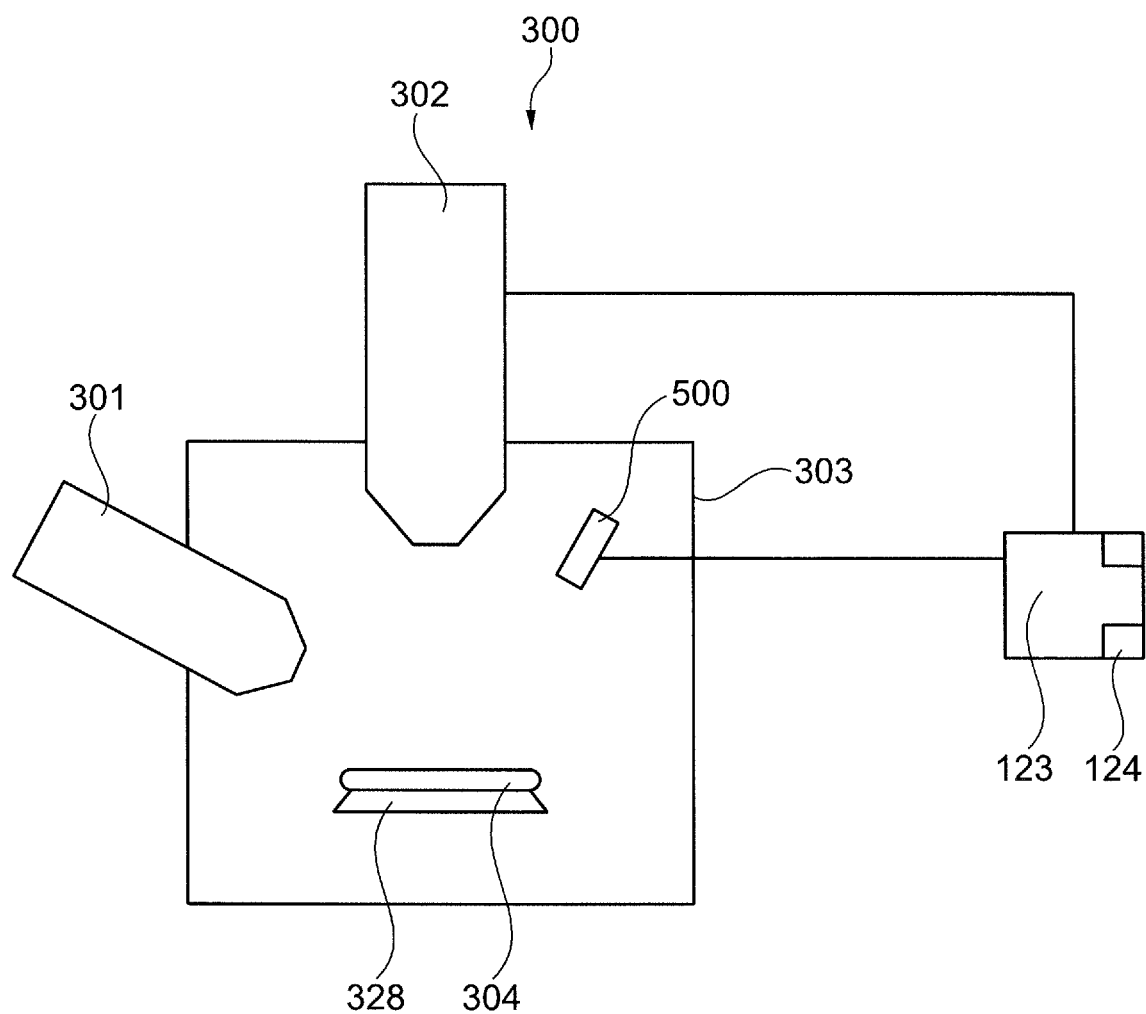
FIG. 3 shows a schematic representation of a third embodiment of a particle beam device.

FIG. 3 shows a schematic illustration of another embodiment of a particle beam device 300 according to the system described herein. The particle beam device 300 may have a first particle beam column 301 in the form of an ion beam column, and a second particle beam column 302 in the form of an electron beam column. The first particle beam column 301 and the second particle beam column 302 may be arranged on an object chamber 303, in which an object 304 to be imaged, analyzed and/or processed may be arranged. It is explicitly noted that the system described herein is not restricted to the first particle beam column 301 being in the form of an ion beam column and the second particle beam column 302 being in the form of an electron beam column. In fact, the system described herein also may provide for the first particle beam column 301 to be in the form of an electron beam column and for the second particle beam column 302 to be in the form of an ion beam column. A further embodiment of the system described herein described herein provides for both the first particle beam column 301 and the second particle beam column 302 each to be in the form of an ion beam column.

Figure 4:
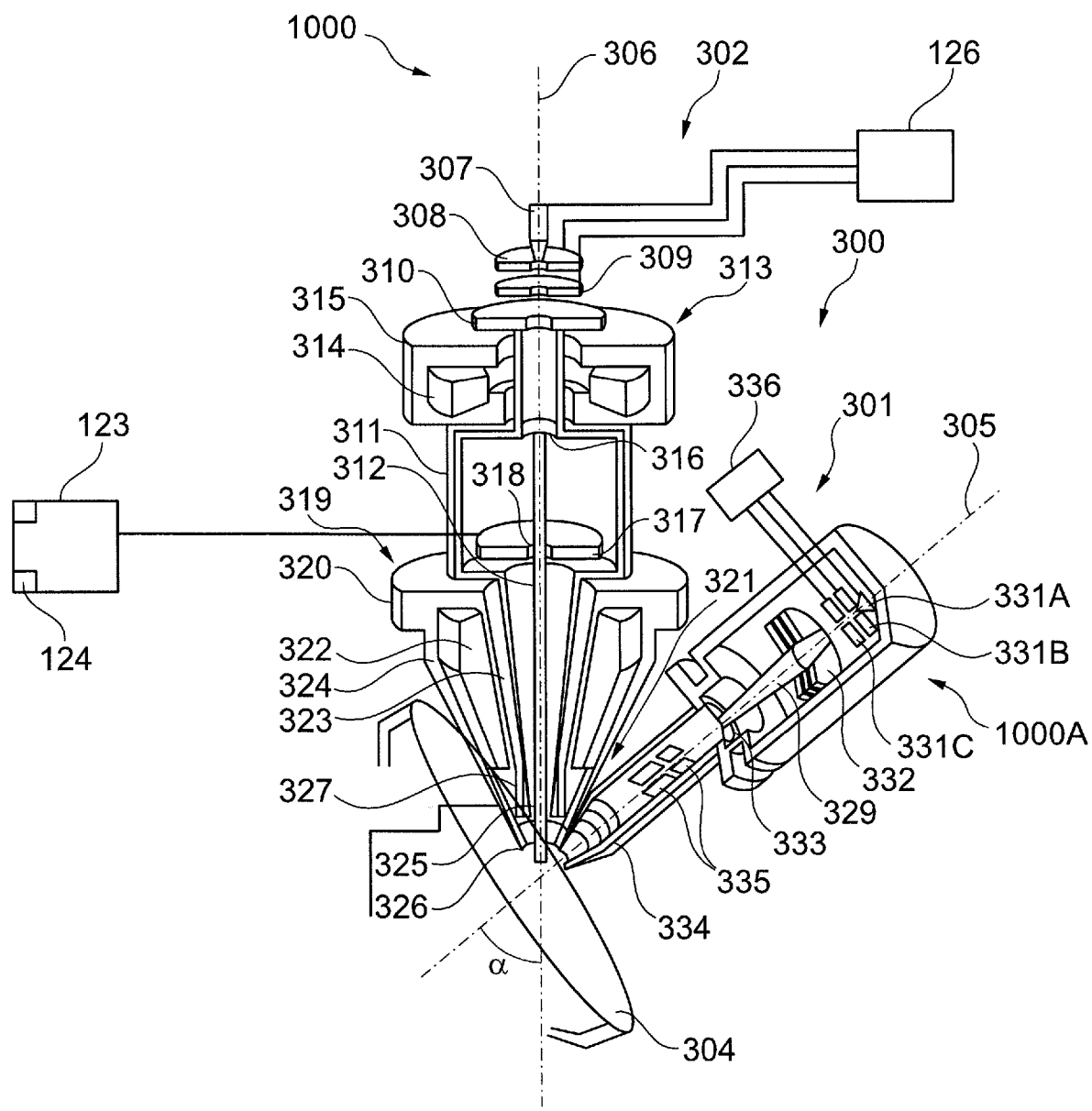
FIG. 4 shows a further schematic representation of the third embodiment of a particle beam device shown in FIG. 3.

FIG. 4 shows a detailed illustration of the particle beam device 300 shown in FIG. 3. For clarity reasons, the object chamber 303 is not illustrated. The first particle beam column 301 in the form of the ion beam column may have a first optical axis 305. Furthermore, the second particle beam column 302 in the form of the electron beam column may have a second optical axis 306.

The second particle beam column 302, in the form of the electron beam column, will be described next. The second particle beam column 302 may comprise a particle beam generator 1000 having a second beam generator 307, a first electrode 308, and a second electrode 309. By way of example, the second beam generator 307 may be a thermal field emitter emitting electrons. The first electrode 308 may have the function of a suppressor electrode, while the second electrode 309 may have the function of an extractor electrode. Moreover, the second particle beam column 302 may comprise a third electrode 310. The third electrode 310 may be an anode, and at the same time may form one end of a beam guide tube 311.

The particle beam generator 1000 may comprise a beam generator control unit 126. The second beam generator 307, the first electrode 308 and the second electrode 309 may be connected to the beam generator control unit 126 and may be supplied with voltage by the beam generator control unit 126. This will be explained in detail further below.

A second particle beam 312 in the form of an electron beam may be generated by the second beam generator 307. Electrons which emerge from the second beam generator 307 may be accelerated to the anode potential, for example in the range of 1 kV to 30 kV, as a result of a potential difference between the second beam generator 307 and the third electrode 310. The second particle beam 312 in the form of the electron beam passes through the beam guide tube 311 and may be focused onto the object 304.

The beam guide tube 311 passes through a collimator arrangement 313 which may have a first annular coil 314 and a yoke 315. Viewed in the direction of the object 304, from the second beam generator 307, the collimator arrangement 313 may be followed by a pinhole diaphragm 316 and a detector 317 with a central opening 318 arranged along the second optical axis 306 in the beam guide tube 311.

The beam guide tube 311 then runs through a hole in a second objective lens 319. The second objective lens 319 may be used for focusing the second particle beam 312 onto the object 304. For this purpose, the second objective lens 319 may have a magnetic lens 320 and an electrostatic lens 321. The magnetic lens 320 may be provided with a second annular coil 322, an inner pole piece 323 and an outer pole piece 324. The electrostatic lens 321 may comprise an end 325 of the beam guide tube 311 and a terminating electrode 326.

The end 325 of the beam guide tube 311 and the terminating electrode 326 concurrently may form an electrostatic deceleration device. The end 325 of the beam guide tube 311, together with the beam guide tube 311, may be at the anode potential, while the terminating electrode 326 and the object 304 may be at a potential which is lower than the anode potential. This may allow the electrons of the second particle beam 312 to be decelerated to a desired energy which may be required for examination of the object 304.

The second particle beam column 302 furthermore may have a raster device 327, by which the second particle beam 312 may be deflected and may be scanned in the form of a raster over the object 304.

For imaging purposes, the detector 317, which may be arranged in the beam guide tube 311, detects secondary electrons and/or backscattered electrons, which result from the interaction between the second particle beam 312 and the object 304. The signals generated by the detector 317 may be transmitted to a control unit 123.

Interaction radiation, for example X-rays or cathodoluminescence light, may be detected by using a radiation detector 500, for example a silicon drift diode (SDD) and/or a photodiode, which may be arranged in the object chamber 303 (see FIG. 3). The radiation detector 500 may be positioned at the side of the object 304 and may be directed to the object 304.

The object 304 may be arranged on an object holder 328 in the form of a sample stage as shown in FIG. 3, by which the object 304 may be arranged such that it may move along three axes which may be arranged to be mutually perpendicular (specifically an x-axis, a y-axis and a z-axis). Furthermore, the sample stage may be rotated about two rotation axes which may be arranged to be mutually perpendicular. It therefore may be possible to move the object 304 to a desired position. The rotation of the object holder 328 about one of the two rotation axes may be used to tilt the object holder 328 such that the surface of the object 304 may be oriented perpendicular to the second particle beam 312 or to the first particle beam 329, which will be described further below. Alternatively, the surface of the object 304 may be oriented in such a way that the surface of the object 304, on one hand, and the first particle beam 329 or the second particle beam 312, on the other hand, are at an angle, for example in the range of 0° to 90°.

As mentioned previously, reference sign 301 denotes the first particle beam column, in the form of an ion beam column. The first particle beam column 301 may have a particle beam generator 1000A for generating ions. The particle beam generator 1000A may comprise a first beam generator 331A in the form of an ion source. The first beam generator 331A may be used for generating the first particle beam 329 in the form of an ion beam. The first beam generator 331A may be a liquid metal ion source (LMIS), for example a gallium liquid metal ion source. It is noted that the system described herein is not restricted to a liquid metal ion source. Rather, any ion source suitable for the system described herein may be used. Furthermore, the particle beam generator 1000A may comprise a suppressor electrode 331B and an extractor electrode 331C. The particle beam generator 1000A may comprise an ion beam generator control unit 336. The first beam generator 331A, the suppressor electrode 331B and the extractor electrode 331C may be connected to the ion beam generator control unit 336 and may be supplied with voltage by the ion beam generator control unit 336. This will be explained in detail further below.

The first particle beam column 301 also may be provided with a collimator 332.

The collimator 332 may be followed by a variable aperture 333 in the direction of the object 304 along the first optical axis 305. The first particle beam 329 may be focused onto the object 304 by a first objective lens 334 in the form of focusing lenses. Raster electrodes 335 may be provided, in order to scan the first particle beam 329 over the object 304 in the form of a raster.

When the first particle beam 329 strikes the object 304, the first particle beam 329 may interact with the material of the object 304. In the process, a small amount of interaction radiation may be generated and may be detected using the radiation detector 500. Interaction particles may be generated, in particular secondary electrons and/or secondary ions. These may be detected using the detector 317.

The object chamber 303 may be operated in a first pressure range or in a second pressure range, wherein the first pressure range only comprises pressures lower than or equal to $10^{-3}$ hPa and wherein the second pressure range only comprises pressures over $10^{-3}$ hPa. A pressure sensor (not shown in FIG. 3) may be arranged in the object chamber 303 for measuring the pressure in the object chamber 303. A vacuum system (not shown in FIG. 3) in the form of a pump system being connected to the pressure sensor and arranged at the object chamber 303 may provide for the pressure range in the object chamber 303, either the first pressure range or the second pressure range.

The first particle beam 329 may also be used to process the object 304. For example, material may be deposited on the surface of the object 304 using the first particle beam 329, wherein the material may be provided with a gas injection system (GIS). Additionally or alternatively, structures may be etched into the object 304 using the first particle beam 329. Moreover, the second particle beam 312 may be used to process the object 304, for example by electron-beam-induced deposition or electron-beam-induced etching.

The detector 317 and the radiation detector 500 may be connected to the control unit 123 as shown in FIGS. 3 and 4. The control unit 123 may comprise a processor 124 into which a computer program product comprising a program code may be loaded, which, when being executed, controls the particle beam device 300 in such a way that a method according to the system described herein is carried out. This will be explained further below.

Figure 5:
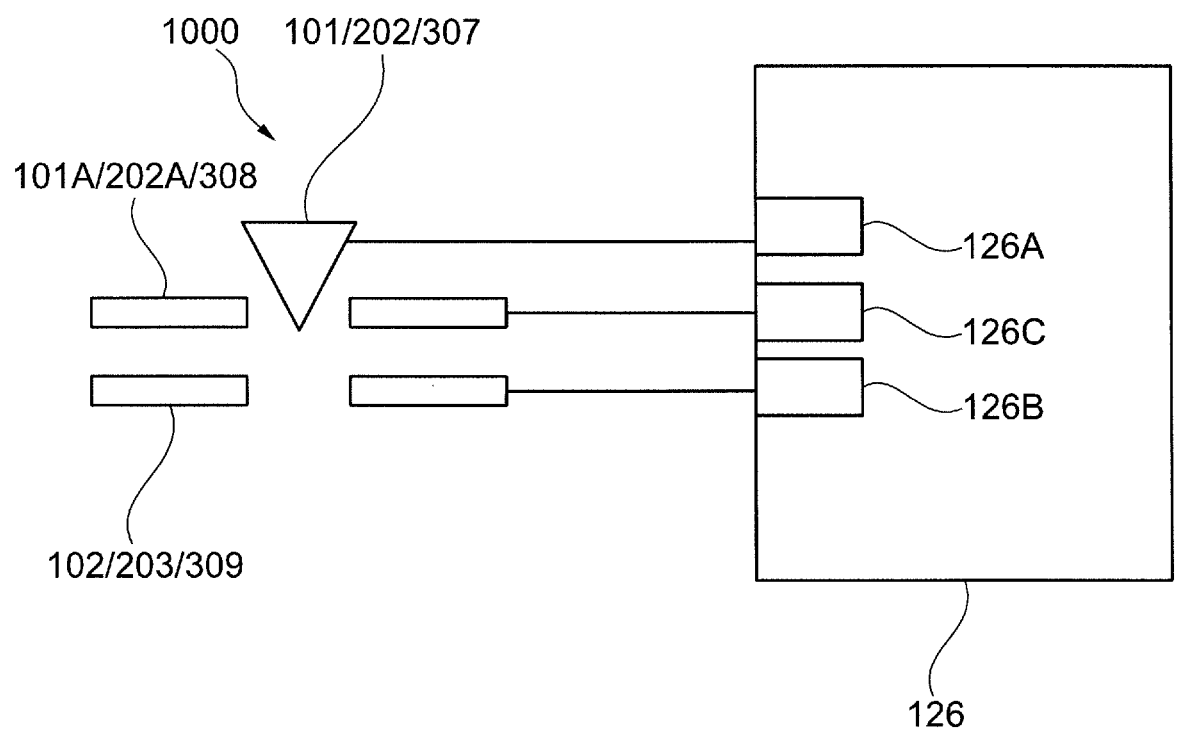
FIG. 5 shows a schematic representation of a first embodiment of a particle beam generator.

FIG. 5 shows the particle beam generator 1000 of the SEM 100 of FIG. 1. As mentioned above, the particle beam generator 1000 may comprise the electron source 101 being a cathode, the suppressor electrode 101A and the extractor electrode 102. As mentioned above, the particle beam generator 1000 also may comprise the beam generator control unit 126. The electron source 101, the suppressor electrode 101A and the extractor electrode 102 may be connected to the beam generator control unit 126. In particular, the electron source 101 may be connected to a variable voltage supply unit, in particular a source high voltage supply unit 126A of the beam generator control unit 126. The source high voltage supply unit 126A supplies the electron source 101 with high voltage. Moreover, the extractor electrode 102 may be connected to a first variable voltage supply unit, in particular a first variable high voltage supply unit 126B of the beam generator control unit 126. The first variable high voltage supply unit 126B supplies a voltage in the form of an extractor voltage to the extractor electrode 102. The extractor voltage may be in the range of 2 kV to 6 kV with respect to the source high voltage, wherein the boundaries may be included in the range. Furthermore, the suppressor electrode 101A may be connected to a second variable voltage supply unit, in particular a second variable high voltage supply unit 126C of the beam generator control unit 126. The second variable high voltage supply unit 126C supplies a voltage in the form of a suppressor voltage to the suppressor electrode 101A. The suppressor voltage may be in the range of 0 V to (−1) kV with respect to the source high voltage, wherein the boundaries may be included in the range.

FIG. 5 also shows the particle beam generator 1000 of the particle beam device 200 of FIG. 2. As mentioned above, the particle beam generator 1000 may comprise the electron source 202 being a cathode, the suppressor electrode 202A and the extractor electrode 203. As also mentioned above, the particle beam generator 1000 further may comprise the beam generator control unit 126. The electron source 202, the suppressor electrode 202A and the extractor electrode 203 may be connected to the beam generator control unit 126. In particular, the electron source 202 may be connected to a variable voltage supply unit, in particular a source high voltage supply unit 126A of the beam generator control unit 126. The source high voltage supply unit 126A supplies the electron source 202 with high voltage. Moreover, the extractor electrode 203 may be connected to a first variable voltage supply unit, in particular a first variable high voltage supply unit 126B of the beam generator control unit 126. The first variable high voltage supply unit 126B supplies a voltage in the form of an extractor voltage to the extractor electrode 203. The extractor voltage may be in the range of 2 kV to 6 kV with respect to the source high voltage, wherein the boundaries may be included in the range. Furthermore, the suppressor electrode 202A may be connected to a second variable voltage supply unit, in particular a second variable high voltage supply unit 126C of the beam generator control unit 126. The second variable high voltage supply unit 126C supplies a voltage in the form of a suppressor voltage to the suppressor electrode 202A. The suppressor voltage may be in the range of 0 V to (−1) kV with respect to the source high voltage, wherein the boundaries may be included in the range.

Furthermore, FIG. 5 shows the particle beam generator 1000 of the second particle beam column 302 in the form of the electron beam column of FIGS. 3 and 4. As mentioned above, the particle beam generator 1000 may comprise the second beam generator 307, the first electrode 308 in the form of a suppressor electrode and the second electrode 309 in the form of an extractor electrode. As also mentioned above, the particle beam generator 1000 further may comprise the beam generator control unit 126. The second beam generator 307, the first electrode 308 and the second electrode 309 may be connected to the beam generator control unit 126. In particular, the second beam generator 307 may be connected to a variable voltage supply unit, in particular a source high voltage supply unit 126A of the beam generator control unit 126. The source high voltage supply unit 126A supplies the second beam generator 307 with high voltage. Moreover, the second electrode 309 may be connected to a first variable voltage supply unit, in particular a first variable high voltage supply unit 126B of the beam generator control unit 126. The first variable high voltage supply unit 126B supplies a voltage in the form of an extractor voltage to the second electrode 309. The extractor voltage may be in the range of 2 kV to 6 kV with respect to the source high voltage, wherein the boundaries may be included in the range. Furthermore, the first electrode 308 may be connected to a second variable voltage supply unit, in particular a second variable high voltage supply unit 126C of the beam generator control unit 126. The second variable high voltage supply unit 126C supplies a voltage in the form of a suppressor voltage to the first electrode 308. The suppressor voltage may be in the range of 0 V to (−1) kV with respect to the source high voltage, wherein the boundaries may be included in the range.

As mentioned above, the particle beam generator 1000 may be a thermal field emitter. This will be explained with respect to the particle beam generator 1000 of the SEM 100 of FIG. 1. The electron source 101 may be heated while being exposed to a strong field which causes electrons to be emitted using the Schottky effect such that an electron beam is generated. The suppressor electrode 101A suppresses emissions of the electrons from the side surface of the electron source 101. Moreover, the extractor electrode 102 extracts the electrons from the electron source 101.

Figure 6:
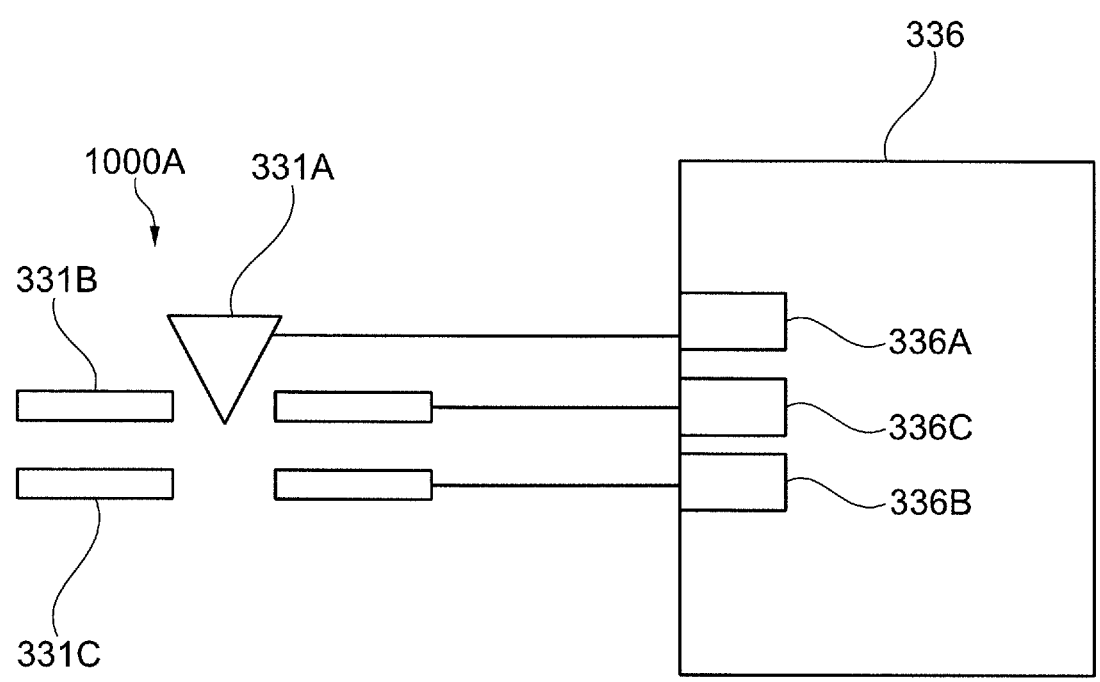
FIG. 6 shows a schematic representation of a second embodiment of a particle beam generator.

FIG. 6 shows the particle beam generator 1000A of the first particle beam column 301 in the form of an ion beam column of FIGS. 3 and 4. As mentioned above, the particle beam generator 1000A may comprise the first beam generator 331A, the suppressor electrode 331B and the extractor electrode 331C. As also mentioned above, the particle beam generator 1000A further may comprise the ion beam generator control unit 336. The first beam generator 331A, the suppressor electrode 331B and the extractor electrode 331C may be connected to the ion beam generator control unit 336. In particular, the first beam generator 331A may be connected to a variable voltage supply unit, in particular an ion high voltage supply unit 336A of the ion beam generator control unit 336. The ion high voltage supply unit 336A supplies the first beam generator 331A with high voltage. Moreover, the extractor electrode 331C may be connected to a first variable voltage supply unit, in particular a first variable high voltage supply unit 336B of the ion beam generator control unit 336. The first variable high voltage supply unit 336B supplies a voltage in the form of an extractor voltage to the extractor electrode 331C. The extractor voltage may be in the range of (−6) kV to (−8) kV with respect to the ion high voltage, wherein the boundaries may be included in the range. Furthermore, the suppressor electrode 331B may be connected to a second variable voltage supply unit, in particular a second variable high voltage supply unit 336C of the ion beam generator control unit 336. The second variable high voltage supply unit 336C supplies a voltage in the form of a suppressor voltage to the suppressor electrode 331B. The suppressor voltage may be in the range of 0 V to 2 kV with respect to the ion high voltage, wherein the boundaries may be included in the range.

When operating the particle beam generator 1000A, the extractor electrode 331C may be biased with a negative high voltage with respect to the first beam generator 331A. The first beam generator 331A may comprise an emission device having a tip, for example an emitter tip carrying a liquid metal. Atoms of the liquid metal on the tip may be ionized due to a strong electric field in the immediate vicinity of the tip. Moreover, the atoms may be accelerated in the direction of the extractor electrode 331C. These ions may form the ion beam. The emission current of the particle beam generator 1000A and, therefore, the ion beam current may be varied by supplying different voltages to the suppressor electrode 331B and/or the extractor electrode 331C.

Figure 7:
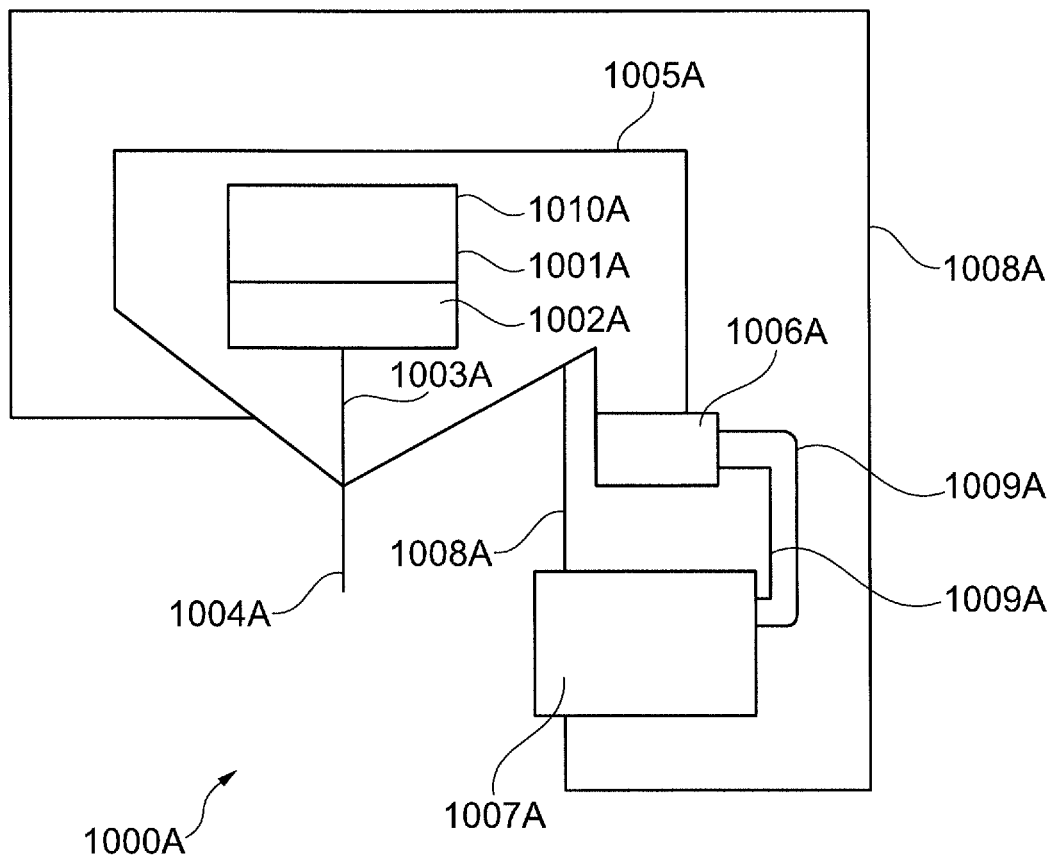
FIG. 7 shows a schematic representation of a particle source of a particle beam generator.

FIG. 7 shows a schematic representation of a particle source 1010A of the particle beam generator 1000A. In particular, the particle source 1010A may be a liquid metal ion source (LMIS), for example a gallium liquid metal ion source. The particle source 1010A may have a container 1001A comprising a liquid metal 1002A, for example liquid gallium. An emission device 1003A, for example in the form of an emission wire, may be arranged in such a way at the container 1001A that liquid metal 1002A may flow from the container 1001A along a surface of the emission device 1003A to a tip 1004A of the emission device 1003A. Due to the arrangement of the particle beam generator 1000A described above, the tip 1004A of the emission device 1003A may be exposed to an electric field sufficient to ionize atoms of the liquid metal and to extract them from the tip 1004A of the emission device 1003A. Thereby, an ion beam comprising ions may be generated.

A heating device 1005A, for example in the form of a heating wire, may be electrically and mechanically connected to the emission device 1003A. Moreover, the heating device 1005A may be electrically and mechanically connected to a current supply unit 1006A. The current supply unit 1006A may provide thermal power to the emission device 1003A and the container 1001A by supplying the heating device 1005A with a heating current. Furthermore, the particle beam generator 1000A may comprise a measuring unit 1007A which is, on one hand, electrically connected to the heating device 1005A via first connecting lines 1008A and which is, on the other hand, electrically connected to the current supply unit 1006A via second connecting lines 1009A. The measuring unit 1007A may be used for measuring a voltage drop at the heating device 1005A via the first connecting lines 1008A. Additionally or alternatively, the measuring unit 1007A may be used for measuring a voltage drop at the current supply unit 1006A via the second connecting lines 1009A.

Embodiments of the method according to the system described herein will now be discussed with respect to the particle beam generator 1000A of the first particle beam column 301 in the form of an ion beam column of the particle beam device 300 of FIGS. 3 and 4. It is noted that embodiments of the method according to the system described herein may be carried out also for the particle beam generator 1000 of the SEM 100 of FIG. 1, of the particle beam device 200 of FIG. 2 and of the second particle beam column 302 in the form of an electron beam column of the particle beam device 300 of FIGS. 3 and 4.

Figure 8:
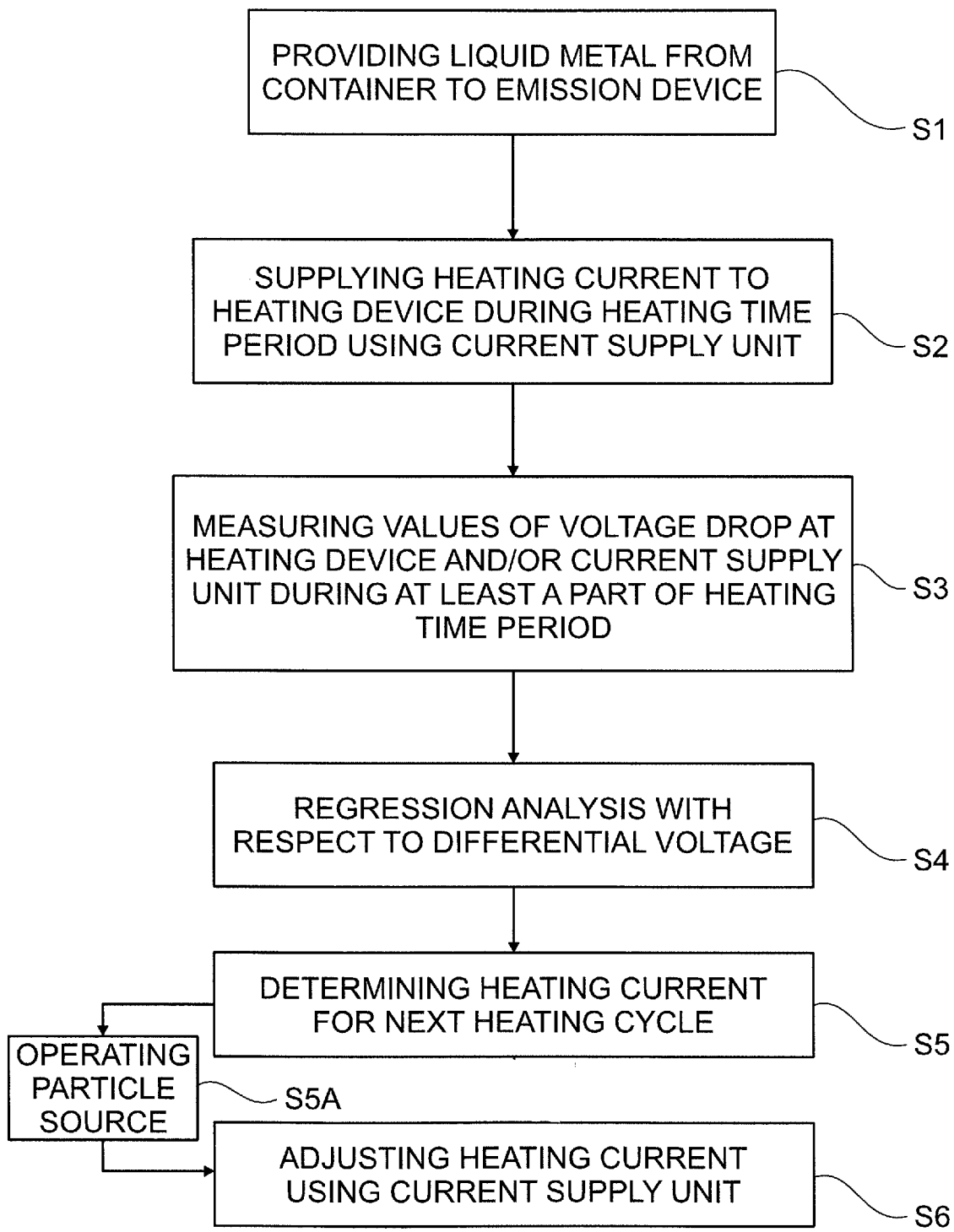
FIG. 8 shows initial steps of an embodiment of the method according to the system described herein.

FIG. 8 shows an embodiment of initial steps, namely an initial heating cycle of an embodiment of the method according to the system described herein. The initial heating cycle may be a first heating cycle. In method step S1, the liquid metal 1002A, in particular liquid gallium, may be provided from the container 1001A to the emission device 1003A which may be an emission wire. In particular, the liquid metal 1002A may flow from the container 1001A along the surface of the emission device 1003A to the tip 1004A of the emission device 1003A. Furthermore, in method step S2, an initial heating current may be supplied to the heating device 1005A during an initial heating time period using the current supply unit 1006A. Therefore, the emission device 1003A and/or the container 1001A is/are heated. The initial heating current and the initial heating time period may be selected as explained below.

The initial heating current may be selected by choosing a low heating current $I_L$ which will not overheat the emission device 1003A. The low heating current $I_L$ may be a current lower than or equal to 3.9 A. Alternatively, the initial heating current may be an estimated heating current $I_e$ which may be calculated using parameters of the heating device 1005A, in particular a resistance and/or a diameter of the heating device 1005A. This will be explained in detail further below.

As mentioned above, the initial heating current may be an estimated heating current $I_e$ which may be determined using the resistance and/or the diameter of the heating device 1005A. This embodiment of the method according to the system described herein is based on the following considerations. Since the particle beam generator 1000A should not be touched by a person after loading the liquid metal 1002A into the container 1001A, the resistance of the heating device 1005A should be measured when no liquid metal 1002A has been loaded in the container 1001A. However, when the emission device 1003A does not comprise any liquid metal 1002A, one does not actually measure the resistance which may be used later to generate the electrical power for heating. This may be disadvantageous.

Therefore, this embodiment of the method is based on the following idea: The diameter of the heating device 1005A may be measured, for example using a micrometer gauge. Moreover, the diameter of the heating device 1005A may be measured at several positions of the heating device 1005A, in particular when the heating device 1005A is unbent. If the values of the measured diameters of the several positions do not differ from each other by more than 3% to 6%, one may use the heating device 1005A for the particle beam generator 1000A and for carrying out embodiments of the method according to the system described herein. The mean value of the measured diameters may be determined, namely the mean diameter $D_e$. The estimated initial heating current $I_e$ may be calculated by using the following equation:

$$I_e = I_r \cdot \left(\frac{D_e}{D_r}\right)^{1.7} \qquad [6]$$

Equation [6] is given by past experience. $I_e$ is the estimated initial heating current, $I_r$ is a reference heating current which may be given by past experience and $D_r$ is a reference diameter which may be given by past experience. For example, $D_r$ may be in the range of 140 µm to 180 µm, in particular 158 µm, wherein the boundaries may be included in the range. The system described herein is not restricted to the aforementioned range. Rather, any reference diameter $D_r$ which is suitable for the system described herein may be used. Furthermore, the reference heating current $I_r$ may be in the range of 3.5 A to 4.5 A, in particular 3.9 A or 4.1 A, wherein the boundaries may be included in the range. The system described herein is not restricted to the aforementioned range. Rather, any reference current $I_r$ which is suitable for the system described herein may be used. Equation [6] provides the estimated initial heating current $I_e$ by scaling the reference heating current $I_r$ to a certain power depending on the mean diameter $D_e$ and the reference mean diameter $D_r$.

The initial heating time period (hereinafter referred to as $T_i$) may be estimated and/or chosen based on past experience. For example, the initial heating time period $T_i$ may be in the range of few seconds to a few hours, for example in the range of 3 seconds to 10 minutes, wherein the boundaries may be included in the range. The system described herein is not restricted to the aforementioned range. Rather, any initial heating time period $T_i$ which is suitable for the system described herein may be used. Alternatively, the initial heating time period $T_i$ may be estimated using the following equation:

$$T_i = T_r - \frac{Q_l}{G_r} \qquad [7]$$

Equation [7] is given by past experience. $T_i$ is the estimated initial heating time period, $T_r$ is a reference heating time period which may be given by past experience, $Q_l$ is the operating time of the particle source 1010A and $G_r$ is a reference value having the unit Ampere (A) and representing the amount of the liquid metal 1002A in the container 1001A. For example, the reference heating time period $T_r$ may be in the range of 20 s to 80 s, in particular 40 s, wherein the boundaries may be included in the range. The system described herein is not restricted to the aforementioned range. Rather, any reference heating time period $T_r$ which is suitable for the system described herein may be used. The operating time $Q_l$ of the particle source 1010A may be the time integral over the emission current at which the particle source 1010A was operated in the past. For example, the emission current of the particle source 1010A may be in the range of 1 µA to 5 µA. The system described herein is not restricted to the aforementioned range. Rather, any value of the emission current may be chosen which is suitable for the system described herein.

In method step S3, values of the voltage drop at the heating device 1005A and/or at the current supply unit 1006A may be measured using the measuring unit 1007A during at least a part of the initial heating time period $T_i$ or during the complete initial heating time period $T_i$. For example, values of the voltage drop may be measured in a specific time interval, for example every 1 second. Accordingly, several values of the voltage drop at the heating device 1005A and/or at the current supply unit 1006A may be obtained as a function of time.

In method step S4, a regression analysis may be carried out based on the measured values of the voltage drop to obtain an equation to determine the differential voltage $U_d$. For example, an exponential regression function $U_R(t)$ in the form of equation [2], namely $$U_R(t) = a + b \cdot \exp(c \cdot t) \qquad [2]$$

may be used for the regression analysis. Furthermore, a quadratic regression function $U_R(t)$ in the form of equation [3], namely $$U_R(t) = a + b \cdot t + c \cdot t^2 \qquad [3]$$

may also be used for the regression analysis.

In method step S5, the heating current $I_h$ for the next heating cycle may be determined. One embodiment of the method according to the system described herein uses the following equation for determining the heating current $I_h$ for the next heating cycle:

$$I_h(2) = I_h(1) \cdot \left(\frac{P_t}{P_d(1)}\right)^{0.12} \qquad [8]$$

$I_h(2)$ is the heating current for the next heating cycle after the initial heating cycle, $I_h(1)$ is the initial heating current of the initial heating cycle, namely the low heating current $I_L$ or the estimated heating current $I_e$, $P_t$ is the target electrical power and $P_d(1)$ is the differential electrical power of the initial heating cycle. The target electrical power $P_t$ is given and the differential electrical power $P_d(1)$ of the initial heating cycle may be calculated as explained further below.

The target electrical power $P_t$ may be in the range of 1000 mW to 2000 mW, for example 1300 mW, wherein the boundaries may be included in the range. The system described herein is not restricted to the aforementioned range. Rather, any value of the target electrical power $P_t$ may be chosen which is suitable for the system described herein. For example, the target electrical power $P_t$ may be determined based on values of the electrical power at which sufficient cleaning of a particle source has been possible in the past and is, therefore, based on empirical values.

The differential electrical power $P_d(1)$ of the initial heating cycle may be determined as follows. After carrying out the regression analysis, the differential voltage $U_d(1)$ of the initial heating cycle may be calculated by subtracting the voltage at the beginning of the heating time period (t=0 s) from the voltage at the end of the initial heating time period $T_i$ similar to equation [4]:

$$U_d(1) = U_R(T_i) - U_R(0) \qquad [9]$$

Accordingly, in method step S5, since the differential voltage $U_d(1)$ may be determined and since the initial heating current $I_h(1)$ may be $I_L$ or $I_e$, the differential electrical power $P_d(1)$ of the initial heating cycle may be determined using equation [10], namely $$P_d(1) = I_h(1) \cdot U_d(1) \quad [10]$$

If all parameters have now been determined for calculating the heating current $I_h(2)$, the heating current $I_h(2)$ for the next heating cycle may be calculated using equation [8].

In method step S5A, the particle source 1010A may be operated until a stable particle emission at a preferred beam current is no longer achieved. Alternatively, the particle source 1010A may be operated for a fixed operating time period, wherein this fixed operating time period may be based on past experience.

In method step S6, the heating current $I_h$ provided by the current supply unit 1006A may be adjusted to the calculated next heating current $I_h(2)$. The heating current $I_h(2)$ now may be used as the heating current $I_h$ in the next heating cycle which is explained further below.

Figure 9:
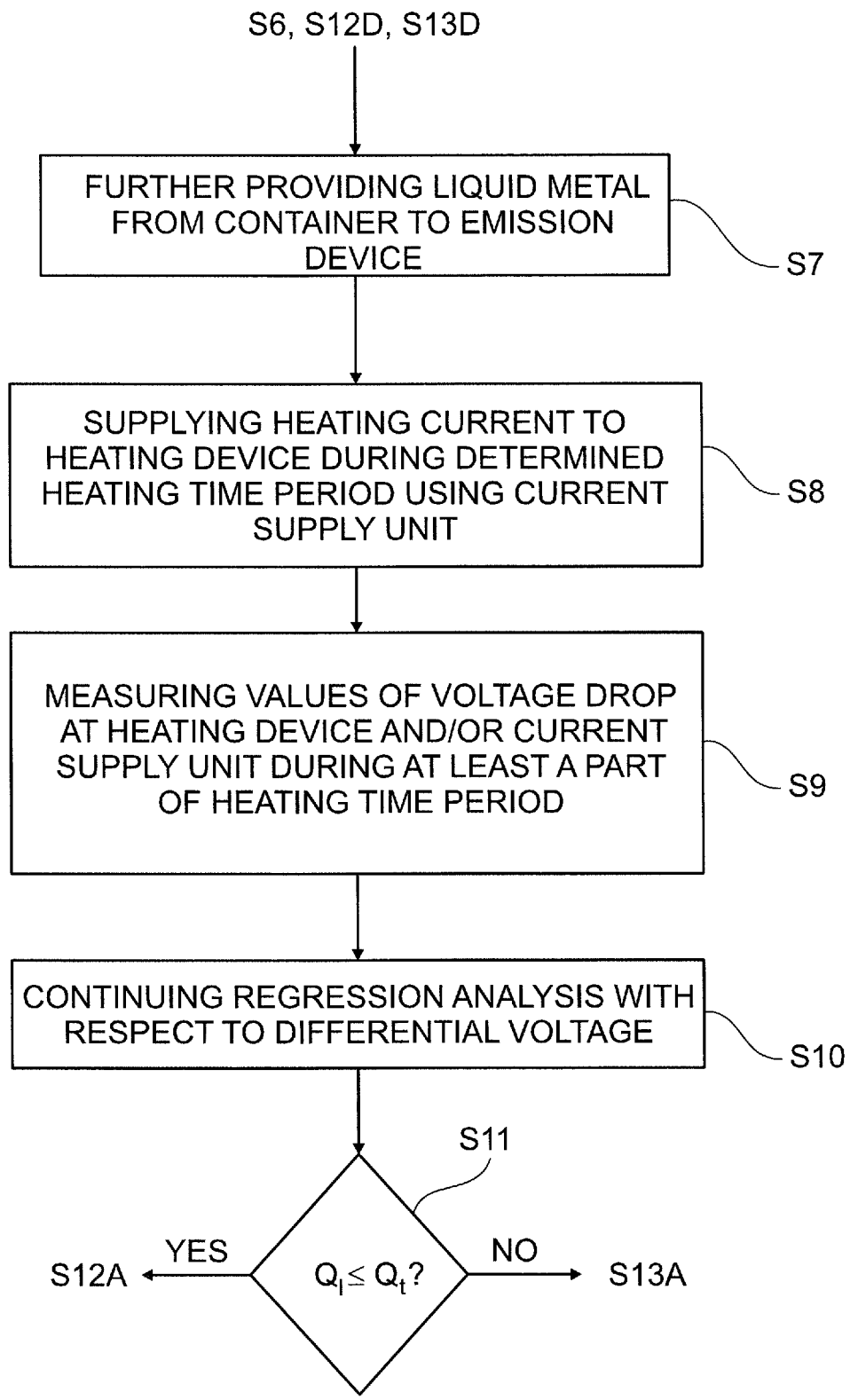
FIG. 9 shows further steps of an embodiment of the method according to the system described herein.

FIG. 9 shows further steps of an embodiment of the method according to the system described herein, namely steps of the next heating cycle, for example a second heating cycle.

In method step S7, the liquid metal 1002A, in particular liquid gallium, may be provided further from the container 1001A to the emission device 1003A. In particular, the liquid metal 1002A may flow from the container 1001A along the surface of the emission device 1003A to the tip 1004A of the emission device 1003A. Furthermore, in method step S8, the heating current $I_h$ determined as the heating current $I_h$ for the next heating cycle may be supplied to the heating device 1005A during a heating time period $T_h$ which also may be determined in method step S8 by $$T_h = T_r - \frac{Q_t}{G_r} \quad [11]$$

Equation [11] is given by past experience. $T_h$ is the heating time period, $T_r$ is the reference heating time period which may be given by past experience, a is the operating time of the particle source 1010A and $G_r$ is the reference value. We refer to the explanation mentioned above which also applies here. The operating time a may be determined as the time integral over the emission current at which the particle source 1010A was operated in the past.

The heating current $I_h$ may be supplied by the current supply unit 1006A. This way, the emission device 1003A and/or the container 1001A is/are heated.

In method step S9, values of the voltage drop at the heating device 1005A and/or at the current supply unit 1006A may be measured using the measuring unit 1007A during at least a part of the heating time period $T_h$ or during the complete heating time period $T_h$. For example, values of the voltage drop may be measured in a specific time interval, for example every 1 second. Accordingly, several values of the voltage drop at the heating device 1005A and/or at the current supply unit 1006A may be obtained as a function of time.

In method step S10, the regression analysis mentioned above may be used to generate a new regression corresponding to equation [2] or [3].

In method step S11, it may be checked whether the operating time $Q_t$ of the particle source 1010A is lower than or equal to a given operating time threshold $Q_r$. In other words, it may be checked whether $Q_t \leq Q_r$. For example, the given operating time threshold $Q_r$ may be 400 pAh. If a $Q_t$, then method steps S12A to S12D may be carried out. If $Q_t > Q_r$, method steps S13A to S13D may be carried out.

Figure 10:
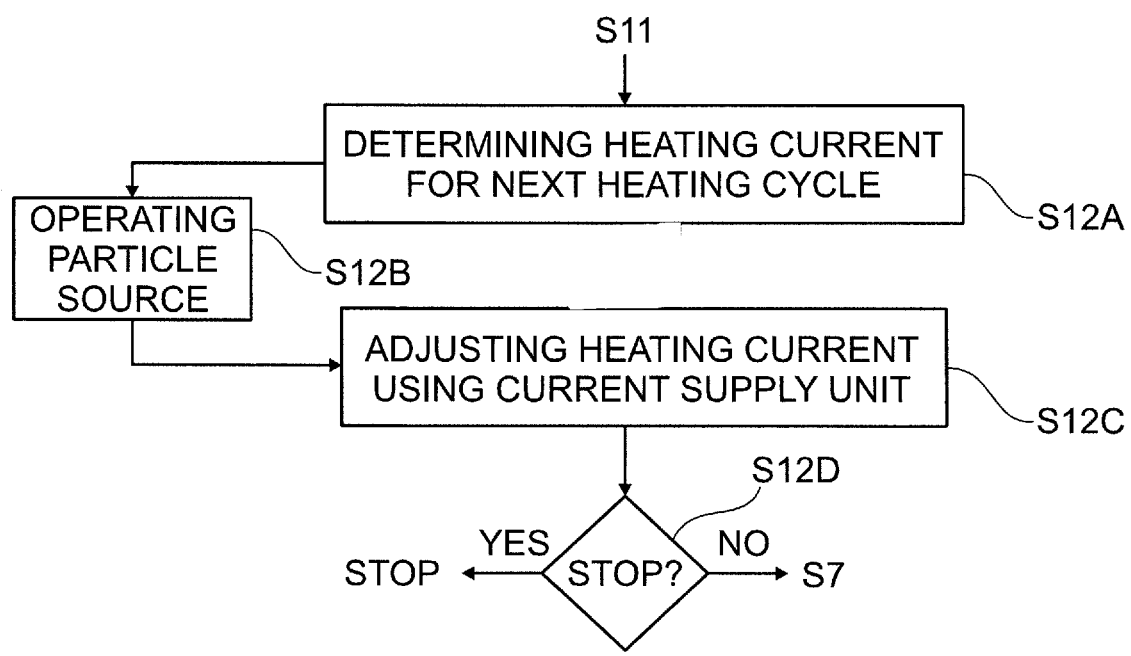
FIG. 10 shows additional or alternative steps of an embodiment of the method according to the system described herein.

FIG. 10 shows further steps of an embodiment of the method according to the system described herein, namely method steps S12A to S12D. In method step S12A, the heating current $I_h$ may be varied in such a way that the heating current $I_h$ for the next heating cycle is determined. In other words, if n is the number of the heating cycle carried out immediately before, the heating current $I_h(n)$ may be varied in such a way that the heating current $I_h(n+1)$ for the next heating cycle may be determined. Hereinafter, the aforementioned also may be called heating current variation phase.

One embodiment of the method according to the system described herein uses the following equation for determining the heating current $I_h(n+1)$ for the next heating cycle:

$$I_h(n+1) = I_h(n) \cdot \left( \frac{P_t}{P_d(n)} \right)^{0.12} \quad [12]$$

Equation [12] is a generalization of equation [8]. n is an integer and is the number of the heating cycle carried out immediately before, $I_h(n+1)$ is the heating current for the next heating cycle, $I_h(n)$ is the heating current of the heating cycle carried out immediately before, $P_t$ is the target electrical power and $P_d(n)$ is the differential electrical power of the heating cycle carried out immediately before. The target electrical power $P_t$ is given and the differential electrical power $P_d(n)$ of the heating cycle carried out immediately before may be calculated as explained further below.

The target electrical power $P_t$ may be given, as mentioned above. The differential electrical power $P_d(n)$ of the heating cycle carried out immediately before may be determined as follows. After carrying out the regression analysis, the differential voltage $U_d(n)$ of the heating cycle carried out immediately before may be calculated by subtracting the voltage at the beginning of the heating time period (t=0 s) from the voltage at the end of the heating time period $T_h$, using to equation [4]:

$$U_d(n) = U_R(T_h) - U_R(0) \quad [4]$$

Accordingly, in method step S12A, if the differential voltage $U_d(n)$ is determined and If the heating current $I_h(n)$ is known, the differential electrical power $P_d(n)$ of the heating cycle carried out immediately before may be determined using equation [13], namely $$P_d(n) = I_h(n) \cdot U_d(n) \quad [13]$$

If all parameters are known or have been determined, the heating current $I_h(n+1)$ for the next heating cycle may be calculated using equation [12].

In method step S12B, the particle source 1010A may be operated until a stable particle emission at the preferred beam current is no longer achieved. Alternatively, the particle source 1010A may be operated for a fixed operating time period, wherein this fixed operating time period may be based on past experience.

In method step S12C, the heating current $I_h$ provided by the current supply unit 1006A may be adjusted to the calculated next heating current $I_h(n+1)$. The heating current $I_h(n+1)$ now may be used as the heating current $I_h$ for the next heating cycle.

In method step S12D, it may be checked whether the embodiment of the method according to the system described herein being performed should be stopped due to the existence of specific conditions. The conditions for stopping such an embodiment will be explained further below. If such an embodiment does not have to be stopped, method steps S7 to S11 may be repeated, and, depending on the operating time Qi, either method steps 12A to 12D or method steps 13A to 13D may be carried out. If the above-mentioned specific conditions have been found to be present, such an embodiment may be stopped.

One embodiment of the method according to the system described herein provides for checking the calculated heating current $I_h(n+1)$ for the next heating cycle with respect to plausibility. In fact, in this embodiment of the method according to the system described herein, the calculated heating current $I_h(n+1)$ for the next heating cycle may be only used for the next heating cycle if the following relation is fulfilled:

$$I_{min} \leq I_h(n+1) \leq I_{max} \quad [14]$$

wherein $I_{min}$ is a given minimum heating current and $I_{max}$ is a given maximum heating current. For example, the minimum heating current $I_{max}$ may be in the range of 2.0 A to 4.0 A, for example 3.6 A, wherein the boundaries may be included in the range. The system described herein is not restricted to the aforementioned range. Rather, any value of the minimum heating current $I_{min}$ may be chosen which is suitable for the system described herein. For example, the maximum heating current $I_{max}$ may be in the range of 4.0 A to 5.0 A, for example 4.3 A, wherein the boundaries may be included in the range. The system described herein is not restricted to the aforementioned range. Rather, any value of the maximum heating current $I_{max}$ may be chosen which is suitable for the system described herein.

One embodiment of the method according to the system described herein provides for limiting the step width between the heating current $I_h(n)$ of the heating cycle carried out immediately before and the calculated heating current $I_h(n+1)$ for the next heating cycle. For example, the following relation may have to be fulfilled:

$$|I_h(n+1) - I_h(n)| \leq I_g \quad [15]$$

wherein $I_h(n+1)$ is the calculated heating current for the next heating cycle, $I_h(n)$ is the heating current of the heating cycle carried out immediately before and $I_g$ is a given threshold step heating current. For example, the threshold step heating current $I_g$ may be in the range of 0.05 A to 0.25 A, for example 0.15 A, wherein the boundaries may be included in the range. The system described herein is not restricted to the aforementioned range. Rather, any value of the threshold step heating current $I_g$ may be chosen which is suitable for the system described herein.

Figure 11:
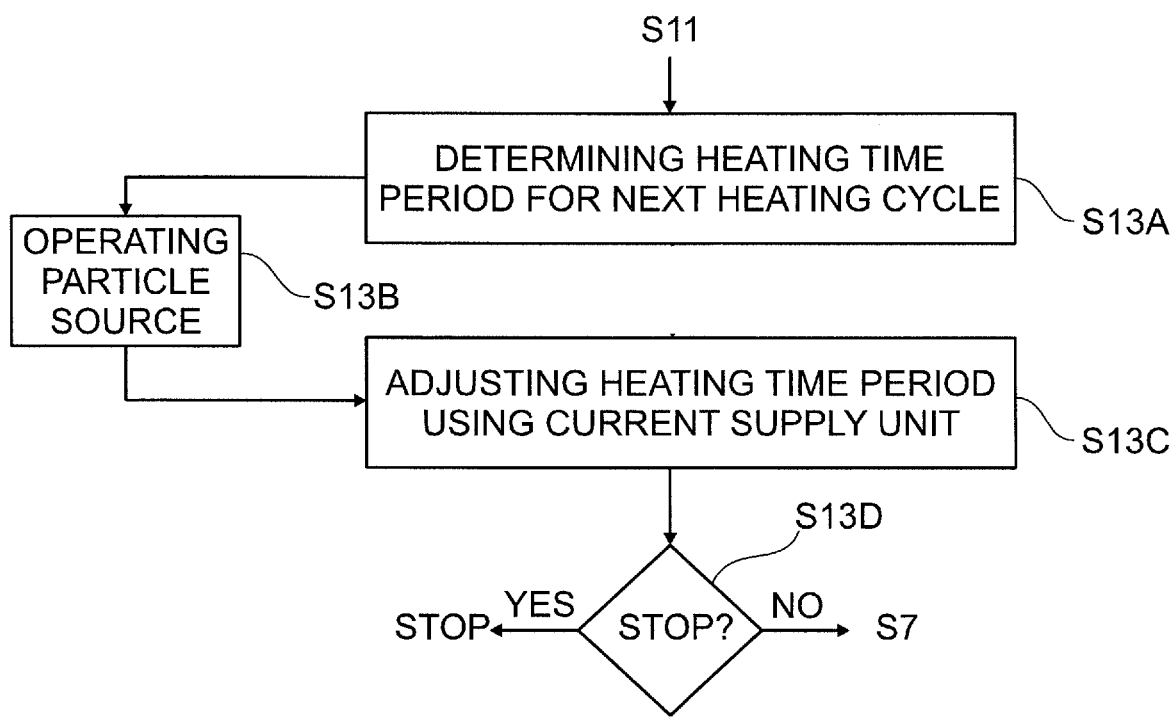
FIG. 11 shows further additional or alternative steps of an embodiment of the method according to the system described herein.

FIG. 11 shows further steps of an embodiment of the method according to the system described herein, namely method steps S13A to S13D. Method steps S13A to S13D may be carried out if $Q_i > Q_r$. This embodiment of the method according to the system described herein may be based on the assumption that a sufficient heating current $I_h$ has been found in the method steps carried out before. Therefore, the heating current $I_h$ may not be varied anymore. Rather, in method step S13A, the heating time period $T_h$ may be varied only. In particular, the heating time period $T_h(n+1)$ for the next heating cycle may be determined. Hereinafter, the aforementioned is also called heating time variation phase.

Below these lines, it will be explained how step S13A of an embodiment of the method according to the system described herein may be carried out for the first time.

One embodiment of the method according to the system described herein uses a differential method and the following equation for determining the heating time period $T_h(n+1)$ for the next heating cycle in method step S13A:

$$T_h(n+1) = T_h(n) - \frac{Q_l(n+1) - Q_l(n)}{G_v(n)} \quad [16]$$

wherein n is an integer and is the number of the heating cycle carried out immediately before, $T_h(n+1)$ is the heating time period for the next heating cycle, $T_h(n)$ is the heating time period for the heating cycle carried out immediately before, $Q_l(n+1)$ is the operating time of the particle source 1010A of the next heating cycle, $Q_l(n)$ is the operating time of the particle source 1010A of the heating cycle carried out immediately before and $G_v(n)$ is a value representing the amount of liquid metal 1002A in the container 1001A in the heating cycle carried out immediately before.

The operating time $Q_l(n)$ may be determined as the time integral over the emission current at which the particle source 1010A was operated in the past. Furthermore, the operating time $Q_l(n+1)$ may be determined as the time integral over the emission current at which the particle source 1010A was operated in the past.

When method step S13A is carried out for the first time, the following may apply: $G_v(n) = G_r$. In other words, when method step S13A is carried out for the first time, the last heating cycle which has been carried out immediately before may be the heating cycle k, wherein k is an integer. The heating current $I_h$ may not be varied anymore. The following may apply: $I_h = I_h(k)$. Moreover, $G_v(k) = G_r$ may apply. The heating time period $T_h(n+1)$ for the next heating cycle k+1, wherein k=n may apply, may be calculated using equation [16].

This embodiment of the method according to the system described herein also may provide for calculating the value $G_v(n+1)$ representing the amount of liquid metal 1002A in the container 1001A in the next heating cycle. For example, the following equation may be used for calculating $G_v(n+1)$:

$$G_v(n+1) = G_v(n) \cdot \left(1 - \frac{1}{T_h(n+1) - T_h(n)} \cdot \frac{P_t - P_d(n+1)}{I_h(k) \cdot U_R'(T_h(n+1))}\right)^{-1} \quad [17]$$

wherein n is an integer and is the number of the heating cycle carried out immediately before, $G_v(n+1)$ represents the amount of liquid metal 1002A in the container 1001A in the next heating cycle, $G_v(n)$ represents the amount of liquid metal 1002A in the container 1001A in the heating cycle carried out immediately before, $T_h(n+1)$ is the heating time period for the next heating cycle, $T_h(n)$ is the heating time period for the heating cycle carried out immediately before, $P_t$ is the target electrical power, $P_d(n+1)$ is the differential electrical power of the next heating cycle, $I_h(k)$ is the heating current of the heating cycle k and $U_R'(T_h(n+1))$ is the derivative of the voltage according to the regression analysis function for the heating time period $T_h(n+1)$ for the next heating cycle.

The parameters used in equation [17] may be known or may be calculated for n=k when carrying out method step S13A for the first time:
the amount of liquid metal 1002A in the container 1001A $G_v(n)$ is known. The following may apply: $G_v(n) = G_r$;
the heating time period $T_h(n)$ is known. The following may apply: $T_h(n) = T_h(k)$.

the heating time period $T_h(n+1)$ for the next heating cycle is calculated using equation [16], as mentioned above;

$P_t$ is the target electrical power and is given, as mentioned above;

the differential electrical power $P_d(n+1)$ of the next heating cycle is $P_d(k+1)$ and may be calculated using the following equation:

$$P_d(k+1)=I_h(k)\cdot U_d(k+1) \qquad [18]$$

wherein $I_h(k)$ is the heating current of the heating cycle k carried out immediately before and $U_d(k+1)$ is the differential voltage of the next heating cycle. The differential voltage $U_d(k+1)$ of the next heating cycle may be calculated using an equation similar to equation [4]:

$$U_d(k+1)=U_R(T_h(k+1))-U_R(0) \qquad [19]$$

the derivative $U_R'(T_h(k+1))$ of the voltage according to the regression analysis may be calculated using equation [2] or [3].

In method step S13B, the particle source 1010A may be operated until a stable particle emission at the preferred beam current is no longer achieved. Alternatively, the particle source 1010A may be operated for a fixed operating time period, wherein this fixed operating time period may be based on past experience.

In method step S13C, the heating time period $T_h(k+1)$ now may be adjusted using the current supply unit 1006A. In method step S13D, it may be checked whether the embodiment of the method according to the system described herein being performed should be stopped. Conditions for stopping the embodiment of the method will be explained further below. If the embodiment of the method does not have to be stopped, method steps S7 to S11 and 13A to 13D may be repeated. If the above-mentioned specific conditions have been found to be present, the embodiment of the method may be stopped.

If method steps S7 to S11 and 13A to 13D are repeated, method steps 13A to 13D may be carried out during this repetition as follows. The embodiment of the method according to the system described herein may use equation [16] for determining the heating time period $T_h(n+1)$ for the next heating cycle, wherein n is an integer and is the number of the heating cycle. All parameters used in equation [16] for calculating the heating time period $T_h(n+1)$ for the next heating cycle may be known, in particular $G_v(n)$, which may have been calculated earlier. As mentioned above, the operating time $Q_l(n)$ may be determined as the time integral over the emission current at which the particle source 1010A was operated in the past. Furthermore, the operating time $Q_l(n+1)$ may be determined as the time integral over the emission current at which the particle source 1010A was operated in the past.

The value $G_v(n+1)$ representing the amount of liquid metal 1002A in the container 1001A in the next heating cycle also may be calculated, for example using equation [17], wherein n is an integer and is the number of the heating cycle carried out immediately before. The parameters used in equation [17] may be known or may be calculated when carrying out method step S13A:

the amount of liquid metal 1002A in the container 1001A $G_v(n)$ is known from the heating cycle carried out immediately before;

the heating time period $T_h(n)$ is known from the heating cycle carried out immediately before;

the heating time period $T_h(n+1)$ for the next heating cycle is calculated using equation [16], as mentioned above;

$P_t$ is the target electrical power and is given, as mentioned above;

the differential electrical power $P_d(n+1)$ of the next heating cycle may be calculated using a generalization of equation [18], namely $$P_d(n+1)=I_h(k)\cdot U_d(n+1) \qquad [20]$$

wherein $I_h(k)$ is the heating current of the heating cycle k and $U_d(n+1)$ is the differential voltage of the next heating cycle. The differential voltage $U_d(n+1)$ of the next heating cycle may be calculated using a generalization of equation [19]:

$$U_d(n+1)=U_R(T_h(n+1))-U_R(0) \qquad [21]$$

the derivative $U_R'(T_h(n+1))$ of the voltage according to the regression analysis may be calculated using equation [2] or [3].

In method step S13C, the heating time period now may be adjusted to $T_h(n+1)$ using the current supply unit 1006A. In method step S13D, it may be checked whether the embodiment of the method according to the system described herein being performed should be stopped. Conditions for stopping the embodiment of the method will be explained further below. If the embodiment of the method does not have to be stopped, method steps S7 to S11 and 13A to 13D may be repeated. If the above-mentioned specific conditions have been found to be present, the embodiment of the method may be stopped.

One embodiment of the method according to the system described herein provides for checking the calculated value $G_v(n+1)$ representing the amount of liquid metal 1002A in the container 1001A in the next heating cycle with respect to plausibility. In fact, in this embodiment of the method according to the system described herein, the calculated value $G_v(n+1)$ for the next heating cycle may be used only for the next heating cycle if the following relation is fulfilled:

$$G_{min}\leq G_v(n+1)\leq G_{max} \qquad [22]$$

wherein $G_{min}$ is a given minimum value and $G_{max}$ is a given maximum value. For example, the minimum value may be in the range of $0.3\times G_r$ to $0.8\times G_r$, for example $0.5\times G_r$, wherein the boundaries may be included in the range. The system described herein is not restricted to the aforementioned range. Rather, any value of the minimum value $G_{min}$ may be chosen which is suitable for the system described herein. The maximum value $G_{max}$ may e.g. be in the range of $1.8\times G_r$ to $2.4\times G_r$, for example $2\times G_r$, wherein the boundaries may be included in the range. The system described herein is not restricted to the aforementioned range. Rather, any value of the maximum value $G_{max}$ may be chosen which is suitable for the system described herein.

When carrying out method step S13A, in one embodiment of the method according to the system described herein, the variation of the heating time period $T_h$ is based on a different approach, namely on an integral method. As explained above, one might obtain the differential electrical power $P_d(n)$ for each heating cycle n. This embodiment of the method according to the system described herein uses an inverse function $U_R^{-1}(U)$ of the regression function $U_R(t)$, for example in the form of equation [2] or [3], to determine the corresponding heating time period $T_l(n)$. For example, the following equation may be used:

$$T_l(n) = U_R^{-1}\left(\frac{P_t}{I_h(k)} + U_R(0)\right) \qquad [23]$$

wherein n is an integer and is the number of the heating cycle carried out immediately before and $U_R^{-1}(U)$ is the inverse function of the regression function $U_R(t)$. The parameters used in equation [23] may be known or may be calculated when carrying out method step S13A:

$P_t$ is the target electrical power and is given;

$I_h(k)$ is the heating current of the heating cycle k, wherein the heating current $I_h(k)$ is not varied anymore;

$U_R(0)$ is the voltage according to the regression analysis function, for example equation [2] or [3] for t=0 s.

The corresponding heating time period $T_l(n)$ may now be determined using equation [23].

Since the actual operating time $Q_l(n)$ of the particle source 1010A for each heating cycle n may be determined as mentioned above, data pairs of the operating time $Q_l(n)$ and the corresponding heating time period $T_l(n)$ may be obtained. This embodiment of the method according to the system described herein now uses a regression analysis resulting in the regression function $T_p$ to determine the heating time period $T_h(n+1)$ for the next heating cycle n+1. For example, a polynomial regression may be used:

$$T_P = \sum_{i=1}^{N} a_i (Q_l - Q_t)^i \qquad [24]$$

wherein $a_i$ is a chosen constant and $Q_l$ is the operating time. The heating time period may be determined using this regression by $$T_h(n+1) = T_p(Q_l(n+1)) \qquad [24a]$$

For example, the following may apply: N=1, $a_0=T_r$, and $a_1=-1/G_r$, wherein $T_r$ is the reference heating time period which may be given by past experience and $G_r$ is the reference value representing the amount of liquid metal 1002A in the container 1001A. In the beginning of the method, the constants $a_i$ may be chosen from the results of past experience. With an increasing number of data pairs, the constants $a_i$ and the order N of the polynomial regression may be varied, wherein the order N may be limited to a chosen value, for example 2 or 3.

If the number of data pairs at the beginning of the embodiment of the method according to the system described herein being performed is low, the polynomial regression [24] with reduced order M (N replaced by M) may be applied to the adapted data pairs $\tilde{T}_l(n)$, $Q_l(n)$, wherein the adaption may be made as follows:

$$\tilde{T}_l(n) = T_l(n) - \sum_{i=M+1}^{N} a_i (Q_l(n) - Q_t)^i \qquad [25]$$

wherein k≤n≤k+M. If M=N, adaption [25] is not needed anymore.

In method step S13B, the particle source 1010A may be operated until a stable particle emission at the preferred beam current is no longer achieved. Alternatively, the particle source 1010A may be operated for a fixed operating time period, wherein this fixed operating time period may be based on past experience.

In method step S13C, the heating time period now may be adjusted to the calculated value $T_h(n+1)$ using the current supply unit 1006A. In method step S13D, it may be checked whether the embodiment of the method according to the system described herein being performed should be stopped. Conditions for stopping the embodiment of the method will be explained further below. If the embodiment of the method does not have to be stopped, method steps S7 to S11 and 13A to 13D may be repeated. If the above-mentioned specific conditions have been found to be present, the embodiment of the method may be stopped.

Conditions for stopping the embodiment of the method in method step 12D and/or in method step 13D will be explained. The embodiment of the method is not restricted to be stopped in method step 12D and/or in method step 13D. Rather, the embodiment of the method may be stopped at any time if the stopping conditions are fulfilled when carrying out the embodiment of the method.

The embodiment of the method according to the system described herein being performed may be stopped if the differential electrical power at a certain time t, namely $P_d(t)$, exceeds the target electrical power $P_t$. In other words, the embodiment of the method may be stopped if the following applies: $P_d(t)>P_t$. If the embodiment of the method is stopped, the heating current $I_h$ is not supplied to the heating device 1005A anymore. As mentioned above, the differential electrical power $P_d$ may be obtained using the measured values of the voltage drop at the heating device 1005A and/or at the current supply unit 1006A. If the differential electrical power $P_d(t)$ at a certain time t is obtained using a single measured value of the voltage drop at the heating device 1005A and/or at the current supply unit 1006A, this measured value might be based on a noisy measured signal and, therefore, might not obtain a correct differential electrical power $P_d(t)$ at a certain time t. Accordingly, an embodiment of the method according to the system described herein might be stopped due to an incorrect differential electrical power $P_d(t)$ value at a certain time t. Therefore, in an embodiment of the method, a regression analysis is carried out based on the measured values of the voltage drop to obtain an equation to determine the differential voltage $U_d$. For example, the exponential regression function $U_R(t)$ in the form of equation [2], namely $$U_R(t) = a + b \cdot \exp(c \cdot t) \qquad [2]$$

may be used for the regression analysis. Furthermore, the quadratic regression function $U_R(t)$ in the form of equation [3], namely $$U_R(t) = a + b \cdot t + c \cdot t^2 \qquad [3]$$

may also be used for the regression analysis. The following equation may be used for calculating the differential voltage $U_d(t)$ at a certain time t:

$$U_d(t) = U_R(t) - U_R(0) \qquad [26]$$

The differential electrical power $P_d(t)$ at a certain time t may be calculated using the following equation:

$$P_d(t) = I_h \cdot U_d(t) \qquad [27]$$

wherein $I_h$ is the heating current currently used. After having calculated the differential electrical power $P_d(t)$, it is compared with the target electrical power $P_t$. An embodiment of the method according to the system described herein may be stopped if the following applies: $P_d(t)>P_t$.

Additionally or alternatively, the embodiment of the method may be stopped if the heating time period $T_h$ exceeds a maximum heating time period $T_{max}$. In other words, the embodiment of the method may be stopped if the following applies: $T_h > T_{max}$. The maximum heating time period $T_{max}$ may be given by the following equation:

$$T_{max} = T_r - \frac{Q_l}{G_r} \qquad [28]$$

$T_r$ is the reference heating time period, $Q_l$ is the operating time of the particle source 1010A and $G_r$ is the reference value representing the amount of the liquid metal 1002A in the container 1001A.

Additionally or alternatively, the embodiment of the method may be stopped if the voltage drop U(t) at the heating device 1005A and/or at the current supply unit 1006A exceeds a given differential voltage threshold $U_t$, for example by more than 50 mV. The differential voltage threshold $U_t$ may be given by equation [5]:

$$U_t = \frac{P_t}{I_h} + U(0) \qquad [5]$$

wherein $U_t$ is the differential voltage threshold, $P_t$ is the target electrical power, $I_h$ is the heating current currently used and U(0) is the voltage drop at the heating device 1005A and/or at the current supply unit 1006A at the initial time, which is t=0 s. Since the measured values of the voltage drop might be based on measured noisy signals, an embodiment of the method according to the system described herein uses the differential electrical power $P_d(t)$ at a certain time t again and compares it to the target electrical power $P_t$. This embodiment of the method according to the system described herein uses the regression analysis mentioned above for calculating the differential electrical power $P_d(t)$. An embodiment of the method according to the system described herein may be stopped if the differential electrical power $P_d(t)$ exceeds the target electrical power $P_t$ by more than a tolerance value in the form of a grace power $P_{grace}$. The grace power $P_{grace}$ may be, for example, 100 mW. The system described herein is not restricted to the grace power $P_{grace}$ to be 100 mW. Rather, the grace power $P_{grace}$ may have any value which is suitable for the system described herein. Therefore, the embodiment of the method may be stopped if the following applies: $P_d(t) > P_t + P_{grace}$.

If the embodiment of the method has been stopped during the heating current variation phase, one might be still interested in continuing the embodiment of the method. However, due to the stop of the embodiment of the method, the heating current $I_h$ for heating the emission device 1003A may have not been supplied during the whole heating time period $T_h$. Rather, the heating current $I_h$ may have been supplied during a heating time period $\tilde{T}$, wherein the following may apply: $\tilde{T} < T_h$. One embodiment of the method according to the system described herein provides for determining the heating current $I_h(n+1)$ for the next heating cycle. According to this embodiment of the method according to the system described herein, the regression function of the regression analysis, in particular equation [2] or [3], as well as equations [4], [12] and [13] may be used to calculate the differential electrical power $P_d(n)$ for the complete heating time period $T_h$. The heating current $I_h(n+1)$ for the next heating cycle may then be calculated using equation [12].

If an embodiment of the method according to the system described herein has been stopped during the differential method of the heating time period variation phase, one might be still interested in continuing the embodiment of the method. However, due to the stop of the embodiment of the method, the heating time period calculated when stopping the embodiment of the method may be $T_h(n+1)$ rather than $T_h(n+1)$, wherein the following may apply: $T_h(n+1) < T_h(n+1)$. It has been observed that such a stop of the embodiment of the method is often related to an event which has reduced the load of the liquid metal 1002A in the container 1001A by a significant amount. Such an event is, for example, an unwanted leak in the container 1001A. However, since it may be difficult to adjust the value $G_v(n)$ representing the amount of liquid metal 1002A in the container 1001A without any verified knowledge about such an event, when continuing the embodiment of the method after the stop, the value $G_v(n)$ representing the amount of liquid metal 1002A in the container 1001A may be left unchanged for the next heating cycle. Therefore, the following may apply: $G_v(n+1) = G_v(n)$. The number of the heating cycle n may be increased by one, namely to n+1. The heating time period $T_h(n)$ of the heating cycle n carried out immediately before may be used for calculating the heating time period $T_h(n+1)$ using equation [16].

If an embodiment of the method according to the system described herein has been stopped during the integral method of the heating time period variation phase, one might be still interested in continuing the embodiment of the method. If the embodiment of the method should be continued, the data pair $T_i(n)$ and $Q_i(n)$ obtained during the heating cycle n in which the embodiment of the method was stopped may not be used. Instead, equation [24] may be used for determining the heating time period $T_h(n+1)$ for the next heating cycle n+1 from the regression function $T_p$.

Various embodiments discussed herein may be combined with each other in appropriate combinations in connection with the system described herein. Additionally, in some instances, the order of steps in the flow diagrams, flowcharts and/or described flow processing may be modified where appropriate. Further, various aspects of the system described herein may be implemented using software, hardware, a combination of software and hardware and/or other computer-implemented modules or devices having the described features and performing the described functions. The system may further include a display and/or other computer components for providing a suitable interface with a user and/or with other computers.

Software implementations of aspects of the system described herein may include executable code that is stored in a computer-readable medium and executed by one or more processors. The computer-readable medium may include volatile memory and/or non-volatile memory, and may include, for example, a computer hard drive, ROM, RAM, flash memory, portable computer storage media such as a CD-ROM, a DVD-ROM, an SO card, a flash drive or other drive with, for example, a universal serial bus (USB) interface, and/or any other appropriate tangible or non-transitory computer-readable medium or computer memory on which executable code may be stored and executed by a processor. The system described herein may be used in connection with any appropriate operating system.

Other embodiments of the system described herein will be apparent to those skilled in the art from a consideration of the specification and/or an attempt to put into practice the system disclosed herein. It is intended that the specification and examples be considered as illustrative only, with the true scope and spirit of the invention being indicated by the following claims.

The invention claimed is:

1. A method of operating a particle beam generator for a particle beam device, comprising:
   providing a liquid metal from a container of a particle source of the particle beam generator to an emission device of the particle source, wherein the container comprises the liquid metal;
   carrying out a first heating cycle for cleaning the particle source, including:
      supplying a heating current to a heating device arranged at the emission device using a current supply unit,
      heating the emission device during a heating time period using the heating device heated by the heating current,
      measuring a value of a voltage drop at the heating device and/or at the current supply unit, and
      adjusting, using the current supply unit, and depending on the measured value of the voltage drop, at least one of: the heating current; and the heating time period; and
   carrying out a second heating cycle for cleaning the particle source and heating the emission device, using at least one of: the adjusted heating current; and the adjusted heating time period.

2. The method according to claim 1, wherein the measured value of the voltage drop is a first value and wherein the second heating cycle includes:
   supplying the adjusted heating current to the heating device arranged at the emission device using the current supply unit;
   heating the emission device during the heating time period using the heating device heated by the adjusted heating current;
   measuring a second value of the voltage drop at the heating device and/or at the current supply unit; and
   adjusting, using the current supply unit, and depending on the measured second value of the voltage drop, at least one of: the adjusted heating current; and the heating time period.

3. The method according to claim 1, wherein the measured value of the voltage drop is a first value and wherein the second heating cycle includes:
   supplying the heating current to the heating device arranged at the emission device using the current supply unit;
   heating the emission device during the adjusted heating time period using the heating device heated by the heating current;
   measuring a second value of the voltage drop at the heating device and/or at the current supply unit; and
   adjusting, using the current supply unit, and depending on the measured second value of the voltage drop, at least one of: the heating current; and the adjusted heating time period.

4. The method according to claim 1, wherein the measured value of the voltage drop is a first value and wherein the second heating cycle includes:
   supplying the adjusted heating current to the heating device arranged at the emission device using the current supply unit;
   heating the emission device during the adjusted heating time period using the heating device heated by the adjusted heating current;
   measuring a second value of the voltage drop at the heating device and/or at the current supply unit; and
   adjusting, using the current supply unit, and depending on the measured second value of the voltage drop, at least one of: the adjusted heating current; and the adjusted heating time period.

5. The method according to claim 1, comprising one of the following:
   (i) the first heating cycle is stopped depending on the measured value of the voltage drop; and
   (ii) the second heating cycle is stopped depending on the measured value of the voltage drop.

6. The method according to claim 1, wherein the measured value of the voltage drop is a first value and wherein the method further comprises:
   measuring a second value of the voltage drop at the heating device and/or at the current supply unit when carrying out the first heating cycle;
   determining an increase of the voltage drop based on the measured first value and the measured second value of the voltage drop; and
   adjusting at least one of: the heating current and the heating time period comprising using the determined increase of the voltage drop for adjusting at least one of: the heating current and the heating time period.

7. The method according to claim 6, wherein determining the increase of the voltage drop includes determining the increase of the voltage drop during a given time period.

8. The method according to claim 1, wherein the method further comprises:
   determining a derivative with respect to a given time using the measured value of the voltage drop at the heating device and/or at the current supply unit; and
   adjusting, using the determined derivative, at least one of: the heating current; and the heating time period.

9. The method according to claim 1, wherein the method further comprises at least one of:
   (i) applying a first voltage using a first voltage supply unit to an extractor electrode configured to extract charged particles from the particle source; and
   (ii) applying a second voltage using a second voltage supply unit to a suppressor electrode configured to suppress emissions of the charged particles from a side surface of the particle source.

10. The method according to claim 1, wherein adjusting at least one of the heating current and the heating time period includes using a regression analysis.

11. A computer program product including a program code which is loaded into a processor and which, when being executed, controls a particle beam device in such a way that a method of operating a particle beam generator for a particle beam device is carried out, the method comprising:
   providing a liquid metal from a container of a particle source of the particle beam generator to an emission device of the particle source, wherein the container comprises the liquid metal;
   carrying out a first heating cycle for cleaning the particle source, including:
      supplying a heating current to a heating device arranged at the emission device using a current supply unit,
      heating the emission device during a heating time period using the heating device heated by the heating current,
      measuring a value of a voltage drop at the heating device and/or at the current supply unit, and adjusting, using the current supply unit, and depending on the measured value of the voltage drop, at least one of: the heating current; and the heating time period; and carrying out a second heating cycle for cleaning the particle source and heating the emission device, using at least one of: the adjusted heating current; and the adjusted heating time period.

12. A particle beam device for imaging, analyzing and/or processing an object, comprising:

at least one particle beam generator for generating a particle beam having charged particles, wherein the particle beam generator includes:
a particle source having an emission device configured to emit charged particles and a container having liquid metal,
a heating device arranged at the emission device,
a current supply unit for providing a heating current, and
a measuring unit for measuring a voltage drop at the heating device and/or at the current supply unit; and
a processor into which a computer program product is loaded, wherein the computer program product comprises a program code which, when being executed, controls the particle beam device in such a way that a method of operating the particle beam generator of the particle beam device is carried out, the method including:
(i) providing the liquid metal from the container of the particle source of the particle beam generator to the emission device of the particle source;
(ii) carrying out a first heating cycle for cleaning the particle source, including:
supplying the heating current to the heating device arranged at the emission device using the current supply unit,
heating the emission device during a heating time period using the heating device heated by the heating current,
measuring a value of a voltage drop at the heating device and/or at the current supply unit, and
adjusting, using the current supply unit, and depending on the measured value of the voltage drop, at least one of: the heating current; and the heating time period; and
(iii) carrying out a second heating cycle for cleaning the particle source and heating the emission device, using at least one of: the adjusted heating current; and the adjusted heating time period.

13. The particle beam device according to claim 12, comprising at least one of the following:
(i) the heating device is a heating wire; and
(ii) the emission device is an emission wire.

14. The particle beam device according to claim 12, wherein the particle beam generator comprises at least one of the following:

(i) a suppressor electrode configured to suppress emissions of the charged particles from a side surface of the particle source; and
(ii) an extractor electrode configured to extract the charged particles from the particle source.

15. The particle beam device according to claim 12, further comprising:
at least one objective lens for focusing the particle beam onto the object; and
at least one detector for detecting interaction particles and/or interaction radiation, the interaction particles and the interaction radiation being generated when the particle beam impinges on the object.

16. The particle beam device according to claim 15, wherein the particle beam generator is a first particle beam generator for generating a first particle beam having first charged particles, wherein the objective lens is a first objective lens for focusing the first particle beam onto the object, and wherein the particle beam device further comprises:
a second particle beam generator for generating a second particle beam having second charged particles; and
a second objective lens for focusing the second particle beam onto the object.

17. The particle beam device according to claim 12, wherein the particle beam device is at least one of the following: an electron beam device; and an ion beam device.

18. A method of operating a particle beam generator for a particle beam device, comprising:
providing a liquid metal from a container of a particle source of the particle beam generator to an emission device of the particle source, wherein the container comprises the liquid metal; and
cleaning the particle source during a heating cycle, including:
supplying a heating current to a heating device arranged at the emission device using a current supply unit, and
heating the emission device using the heating device heated by the heating current;
measuring a value of a voltage drop at the heating device and/or at the current supply unit;
determining a differential electrical power using the measured value of the voltage drop, wherein the differential electrical power is the difference between a first electrical power and a second electrical power; and
stopping supplying the heating current if the differential electrical power exceeds a given target electrical power.

19. The method according to claim 18, wherein the first electrical power is a final electrical power achieved at the end of the heating cycle and wherein the second electrical power is an initial electrical power achieved at the beginning of a heating cycle.

20. The method according to claim 18, wherein determining the differential electrical power includes using a regression analysis.

* * * * *